United States Patent
Hwu et al.

(10) Patent No.: US 6,414,973 B1
(45) Date of Patent: Jul. 2, 2002

(54) HIGH-POWER BLUE AND GREEN LIGHT LASER GENERATION FROM HIGH POWERED DIODE LASERS

(76) Inventors: Ruey-Jen Hwu, 3767 East Brockbank Dr., Salt Lake City, UT (US) 84124; John M. Worlock, 2440 E. 900 S, Salt Lake City, UT (US) 84108-1441; Mike Willis, 329 S 3430 E., New Harmony, UT (US) 84757; Robert Gwynn, 5016 Overlook Dr., Bloomington, MN (US) 55437

(*) Notice: Subject to any disclaimer, the term of this patent is extended or adjusted under 35 U.S.C. 154(b) by 2 days.

(21) Appl. No.: 09/652,490

(22) Filed: Aug. 31, 2000

Related U.S. Application Data

(60) Provisional application No. 60/151,664, filed on Aug. 31, 1999, provisional application No. 60/151,779, filed on Aug. 31, 1999, provisional application No. 60/157,381, filed on Oct. 1, 1999, and provisional application No. 60/156,982, filed on Oct. 1, 1999.

(51) Int. Cl.$^7$ ................................................ H01S 3/098
(52) U.S. Cl. .............................. 372/19; 372/22; 372/9; 372/32
(58) Field of Search ................................ 372/19, 22, 9, 372/32

(56) References Cited

U.S. PATENT DOCUMENTS

| | | |
|---|---|---|
| 5,067,134 A | 11/1991 | Oomen |
| 5,295,144 A | 3/1994 | Lawrenz-Stolz et al. |

(List continued on next page.)

OTHER PUBLICATIONS

Pan et al; Spectral and temporal coherence of broad–area lasers with grating feedback; J. Opt. Soc. Am B, vol. 15, No. 10; Oct., 1998, pp. 2531–2536.*

Pan, M.–W., D. J. Evans, and G. R. Gray, *Spatial and temporal coherence of broad–area lasers with grating feedback*, University of Utah, Oct. 1998, pp. 2531–36.

Pan, M.–W., D. J. Evans, and G. R. Gray, SIAM Activity Group on Dynamical Systems, abstract entitled "Spatio–Temporal Dynamics of Broad–Area Semi–Conductor Lasers with Optical Feedback," *Program for Society for Industrial and Applied Mathematics Program and Abstracts*, Snowbird, Utah, May 18–May 22, 1997, p. 39.

*Primary Examiner*—Leon Scott, Jr.
(74) *Attorney, Agent, or Firm*—Christensen O'Connor Johnson Kindness PLLC

(57) ABSTRACT

A device for generating blue or green laser light by the use of a device comprising an infrared high power semiconductor laser or an infrared high power semiconductor laser bar or array, a diffractive optical device, and an optical device utilizing a non-linear crystal to generate the blue or green laser light. In one embodiment, the diffractive optical device comprises a volume holographic transmission grating and the optical device comprises a ring resonator. In another embodiment, the diffractive optical device comprises a reflective diffraction grating feedback mechanism and the optical device comprises a ring resonator. In another embodiment, the optical device comprises a parabolic or non-planar feedback mechanism and a ring resonator. In another embodiment, the diffractive optical feedback device, which can be in the form of digital/binary optics, is attached to the semiconductor laser source. In yet another embodiment, the diffractive optical device comprises a hybrid lens comprising a plano-convex lens and a diffractive device, which also can be in the form of digital/binary optics, attached thereto. And in yet another embodiment, a pump configuration is used to amplify a corrected single mode laser beam with higher input power of laser bar or array to feed a nonlinear material to create a very high-powered blue or green laser beam. The above-described embodiments for generating continuous blue or green laser light provide a reliable, low-cost device having a relatively simple construction.

42 Claims, 18 Drawing Sheets

U.S. PATENT DOCUMENTS

| | | |
|---|---|---|
| 5,305,345 A | 4/1994 | Albrecht et al. |
| 5,623,510 A | 4/1997 | Hamilton et al. |
| 5,651,019 A | 7/1997 | Goldberg et al. |
| 5,651,021 A | 7/1997 | Richard et al. |
| 5,691,989 A | 11/1997 | Rakuljic et al. |
| 6,002,703 A * | 12/1999 | Hwu et al. ............ 372/92 |
| 6,094,297 A | 7/2000 | Injeyan et al. |
| 6,108,356 A | 8/2000 | Yin |

| PHYSICAL QUANTITY | SYMBOL | VALUE |
|---|---|---|
| LASER WAVELENGTH | $\lambda$ | 980 nm |
| GAIN REGION LENGTH | $L$ | 250 $\mu m$ |
| CONTACT STRIPE WIDTH | $w$ | 100 $\mu m$ |
| ACTIVE LAYER THICKNESS | $d$ | 1 $\mu m$ |
| TRANSVERSE CONFINEMENT FACTOR | $\Gamma$ | 0.2 |
| FACET REFLECTIVITIES | $R_0 R_L$ | 0.05 |
| EFFECTIVE INDEX | $n_{eff}$ | 3.5 |
| KERR COEFFICIENT | $n_2$ | 0.0 |
| LINEWIDTH-ENHANCEMENT FACTOR | $\alpha$ | 3.0 |
| INTERNET LOSS | $\alpha_{int}$ | $1000 m^{-1}$ |
| GAIN CROSS SECTION | $\alpha$ | $1.5 \times 10^{-20} m^2$ |
| DIFFUSION CONSTANT | $D$ | $0.0033 m^2/s$ |
| TRANSPARENCY CARRIER DENSITY | $N_0$ | $1.0 \times 10^{24} m^3$ |
| NON-RADIATIVE LIFETIME | $\tau_{nt}$ | 5ns |
| SPONTANEOUS-EMISSION COEFFICIENT | $B$ | $1.4 \times 10^{-16} m^3/s$ |

*Fig. 8.*

HIGH-POWER BLUE AND GREEN LIGHT LASER GENERATION FROM HIGH POWERED DIODE LASERS

CROSS-REFERENCE TO RELATED APPLICATIONS

This nonprovisional application claims the benefit under 35 U.S.C. § 119(e) of U.S. Provisional Application No. 60/151,664, filed Aug. 31, 1999, entitled "GREEN LIGHT LASER, LASER BEAM COUPLER, AND METHODS"; U.S. Provisional Application No. 60/151,779, filed Aug. 31, 1999, entitled "BLUE LIGHT LASER AND METHODS"; U.S. Provisional Application No. 60/157,381, filed Oct. 1, 1999, entitled "LOW-COST, HIGH-POWER GREEN LASERS"; and U.S. Provisional Application No. 60/156,982, filed Oct. 1, 1999, entitled "HIGH-POWER BLUE LIGHT GENERATION FROM DIODE LASERS." The subject matter of each of these applications is specifically incorporated herein by reference.

FIELD OF THE INVENTION

The present invention relates to high-powered laser sources, more specifically, the present invention relates to an apparatus for generating high-powered green and blue light lasers.

BACKGROUND OF THE INVENTION

Lasers are widely used in a wide range of products involving digital audio and video media, telecommunications, remote sensing, electro-optic countermeasures, and other products. Because of the increasing demand for products utilizing lasers, the need for high power lasers has increased over the years in some technology areas. It is also known that the there is an increasing demand for blue and green light lasers, i.e., lasers having a wavelength in the 300 to 600 nm range. Conventionally, in order to provide a blue or green laser with increased power, it was necessary to increase the complexity and size of the laser, resulting in a substantial cost increase. Thus, an expensive laser that filled an entire room could provide a desired power level, but was infeasible for many applications.

In currently known optical systems, light propagation is commonly controlled by optics based on reflection and refraction. Many existing optical systems rely only on reflection and refraction to achieve the desired beam transformation. However, it is known that diffraction can also be used to achieve beam transformation in optical system design. In diffractive optics design, surface (two-dimensional) profiles can be designed to manipulate phase front of an optical beam in order to achieve the desired beam transformation. For example, diffractive optics can be designed to very effectively correct spherical aberration that is inherent to conventional lenses based on reflection and refraction. In addition, traditional lens designs based on reflection and refraction are based mainly on three-dimensional structures, which have a higher degree of complexity in the construction. The three-dimensional structure also makes the integration of the lens component into optical systems more difficult and less compact.

SUMMARY OF THE INVENTION

The present invention provides a system and method for generating a high-power blue or green light laser beam. The present invention utilizes a compact, low-cost design to produce a high-power, stable, single-mode output beam from an unstable, multi-mode diode laser source. More specifically, the high-power laser source is an infrared broad-area semiconductor laser having at least one watt of output power or a broad-area semiconductor laser bar or array having at least twenty watts of output power. The high-power multi-mode laser source is focused into a small area and directed into a nonlinear crystal through the use of diffractive optics. In one case, the light beam passing through the nonlinear crystal generates a blue laser light through frequency doubling and, in another case, generates a single mode longer wavelength laser light, which is converted to a green laser light through an alternative nonlinear crystal. The blue or green light is produced through frequency doubling in the nonlinear crystal. The use of diffractive optics effectively corrects longitudinal spherical aberrations created by the conventional lenses and, in addition, the diffractive optics effectively focuses the output beams from broad-area semiconductor lasers, broad-area semiconductor laser bars or laser arrays. For the case of the high-power multi-mode laser source directly generating a blue or green laser light, diffractive optics are used to provide the necessary feedback to obtain a single mode laser light prior to entering the nonlinear crystal for frequency doubling.

In one embodiment of the present invention, optical feedback devices are used for the modal shaping and pattern stabilization of high-output-power diode lasers. In various configurations, non-planar surfaces are used for the modal shaping and generation of a single mode corrected laser beam. These non-planar surfaces are diffractive optics, which include traditional grating devices, advanced digital and binary optics, and continuous surface relief diffractive optics. Traditional grating devices of both transmissive and reflective types are used as a feedback mechanism to the source laser to produce a stable, single-mode laser to be used with a non-linear laser to produce a blue or green laser. One example of a transmissive diffraction grating is a volume holographic transmission grating. Examples of a reflective diffraction grating include linear and blazed reflection grating. Diffractive optics including digital/binary optics and continuous surface-relief diffractive optics can also be made to be either transmissive or reflective. The stable, single-mode beam created by the diffractive feedback is suitable for use in a ring resonator or other cavity designs utilizing a nonlinear crystal to generate a blue or green laser.

In another embodiment, diffractive optical elements including binary/digital optics or continuous surface-relief diffractive optics are provided for modal shaping and correction for cavities optimized for second harmonic. These elements have diffractive surfaces located directly on the laser crystal and/or cavity mirrors resulting in a passive modulation or correction of the feedback in the laser cavity. The feedback can be used to optimize the modal characteristics of the cavity, which can lead to much greater second harmonic generation efficiency.

In another embodiment of the present invention, diffractive optics are used to focus the output beam of a high-power laser. Due to the nature of the emitting light beam of broad-area semiconductor lasers, i.e., highly divergent in one direction (over 40 degrees half angle) and less divergent in the second direction (approximately, 8 degrees half angle), the use of a conventional lens design to focus a light beam suffers greatly from longitudinal spherical aberration. In this embodiment, a diffractive optical device is attached to a piano-convex lens for correcting the longitudinal spherical aberrations created by the conventional lens. The surface of the diffractive optics can also be digitized into a digital/ binary optics format. Furthermore, these surface profiles, digitized or not, can be attached directly on the surface of a conventional lens. Thus, the hybrid focusing lens (coupler) created by the diffractive optical device and the plano-convex lens allows for higher power to be directed into a nonlinear crystal for second harmonic generation.

The above-described embodiments of the present invention, comprise the following elements: a focusing lens (coupler) based on diffractive optics theory to effectively capture and direct the output light seam coming from a high-power broad area infrared laser diode, and an optical feedback structure based on diffractive optical components to correct the quality of the laser beam. For the focusing lens (coupler), the design is accomplished by first obtaining the necessary phase changes two different size collimated beams, corresponding to two different emitting directions, will need to go through to become focused. The difference of these two phase changes becomes the phase that should be provided by the diffractive optics for the laser light to be focused without longitudinal spherical aberration. The fabrication is accomplished through diffractive optical component fabrication techniques such as gray-scale mask continuous surface-relief diffractive optics fabrication and photolithography binary optics fabrication techniques.

For the mode correction, the design of the present invention is based on the idea of providing an optical feedback which is not directly proportional to the original light distribution and, as a result, discouraging the possibility of stronger (weaker) signals receive stronger (weaker) feedback and become even stronger (weaker). Therefore, any feedback device allows for the redistribution of the amplitude or phase of the light can, theoretically, provide certain level of mode control. Under this design concept, the above-described components provide feedback that is not directly proportional to its original signal, which helps to eliminate the filamentation. It is further evidenced that the higher level the redistribution of the original signal that the device creates in the feedback, the higher capability the device possesses in discouraging filamentation. Diffractive components which allow the redistribution of the original light beam (when the light is directly reflected or the light is transmitted and then reflected by a mirror) can provide mode control of the output of the broad-area semiconductor lasers. Therefore, the mode controlling component of the present invention may include any type of diffractive optical components, such as, both amplitude gratings and phase gratings. Phase modulation in a phase grating is controlled through the change of the refractive index of a material such as a volume grating, through the change of physical thickness of a material such as a linear/blazed diffraction grating, or through a more advanced grating component such as surface-relief diffractive optics and digital (binary) optics of both transmissive and reflective types. One example of a transmissive grating includes a holographic grating. The diffractive surface of these optical components is an effective beam shaping and controlling device that is compact in size, and planar (two-dimensional) realization, thus, simplifying the manufacturing process of such a device.

In another embodiment of the present invention, the laser source comprises a diode laser bar and/or a diode laser array with an output of twenty watts or higher. These bars or arrays usually have an output width of 1 cm, versus about 100 micrometers of a broad area diode laser, therefore, capturing the light from these laser arrays is even more difficult than the broad area diode lasers described above. Accordingly, the present invention is applied to control beams emitted from diode laser bar and/or a diode laser array so that they are suitable for use in either an end-pumped or side-pumped configuration. In these pump configurations, single-mode laser light at a longer wavelength is first produced via a gain medium; this single-mode laser light is then used to effectively produce a single mode blue or green laser hit light through a nonlinear crystal.

The present invention also involves novel designs for coupling pump radiation into a laser crystal. The couplers involve light ducts and concentrators of various profiles in addition to high reflective beam shapers. These couplers use planar, conic, and quasi-parabolic surfaces. The couplers are made of solid materials, hollow, or hollow with additional corrective elements. In addition to beam shaping, these couplers are also used to provide some control of the beam quality through manipulating the distribution of light intensity. The concept of diffractive optics is also employed to incorporate phase-correcting surfaces into the design of these couplers. This novel design can be utilized to optimize the modal properties of the laser cavity by modifying the crystal excitation profile and thus influencing the gain profile in the crystal. This is extremely important since the modal properties of the laser cavity are crucial to the success of achieving high second-harmonic output power.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 8 is a table listing the parameter values used in the equation models of the corrected laser beam;

DETAILED DESCRIPTION OF THE PREFERRED EMBODIMENT

The present invention provides a system and method for generating a high-power blue or green light laser beam. More specifically, the system of the present invention utilizes a compact, low-cost design to produce a high-power, stable, single-mode output beam having a wavelength in the blue/green region. The system and method of the present invention consists of two major components: a mode-controlling device for eliminating the formation of filamentation and promotion of single mode operation of high power infrared broad-area semiconductor lasers, and a frequency doubling device, such as a nonlinear crystal, for producing the green or blue laser light. In one embodiment, the laser beam coupling device is formed from a diffractive optics device to effectively focus the output light beam emitting from a high-power broad area infrared laser diode into the nonlinear crystal or gain medium.

Figure 1A:
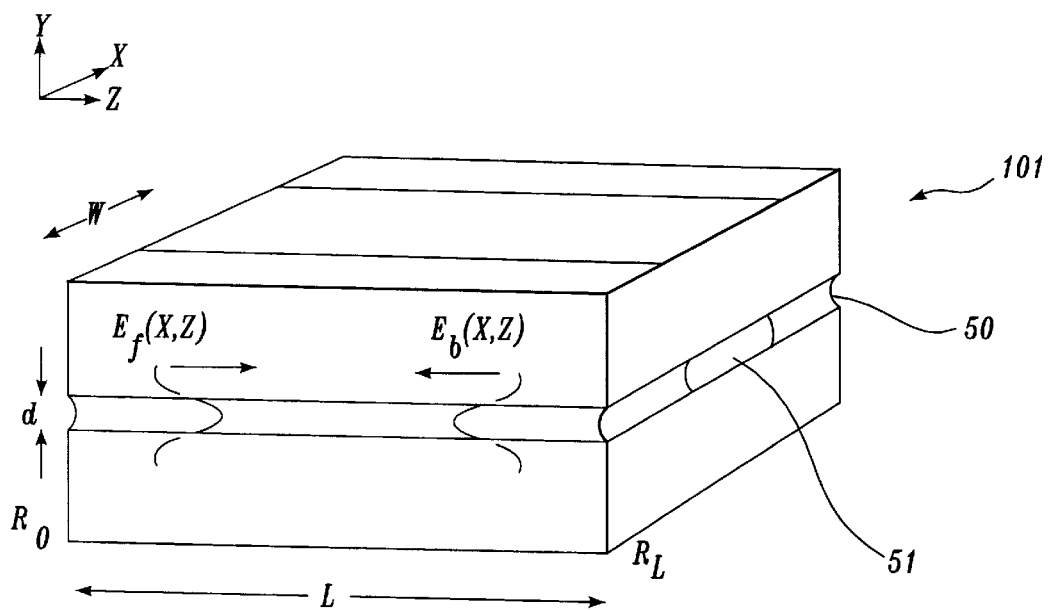
FIGS. 1A–1B illustrate perspective and side views of a semiconductor laser device that can be used in several embodiments of the present invention.

FIG. 1A is a schematic depiction of a conventional broad-area semiconductor diode laser 101 used in accordance with one embodiment of the present invention. The semiconductor laser 101 has a length L and a stripe width w. An active layer 50 forming an active gain region of semiconductor laser 101 has a thickness d and an aperture or facet 51 formed therein for emitting laser light. An anti-reflection coating can be formed on the end of semiconductor laser 101 where the facet 51 is located, and a high reflection coating can be formed on the other end. The facet reflectivity located at z=0 and z=L are $R_0$ and $R_L$, respectively. The forward traveling wave in the x-z plane in semiconductor laser 101 is represented by $E_f$, while the backward traveling wave is represented by $E_b$. The semiconductor laser 101 shown in this embodiment is approximately one watt.

The semiconductor laser 101 emits light from aperture 51 in a widely divergent beam, also referred to a broad area laser beam, with an angle of divergence in the x-z plane greater than about 80° and an angle of divergence in the y-z plane up to about 16°. The semiconductor laser 101 can be formed of a gallium aluminum arsenic compound or other suitable material known to those skilled in the art.

Figure 1B:
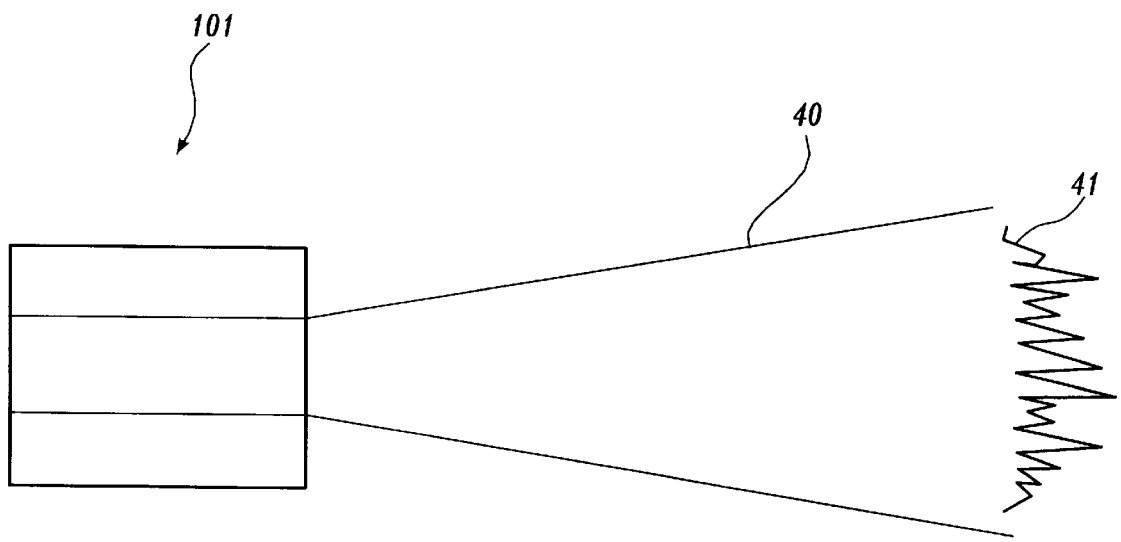

FIG. 1B is a side view schematic illustration of semiconductor laser 101 during operation without any external reflectors or other optics. As shown, a beam 40 is emitted from semiconductor laser 101 and diverges into a number of undesirable filaments represented by an intensity profile 41 having a jagged shape.

Figure 2A:
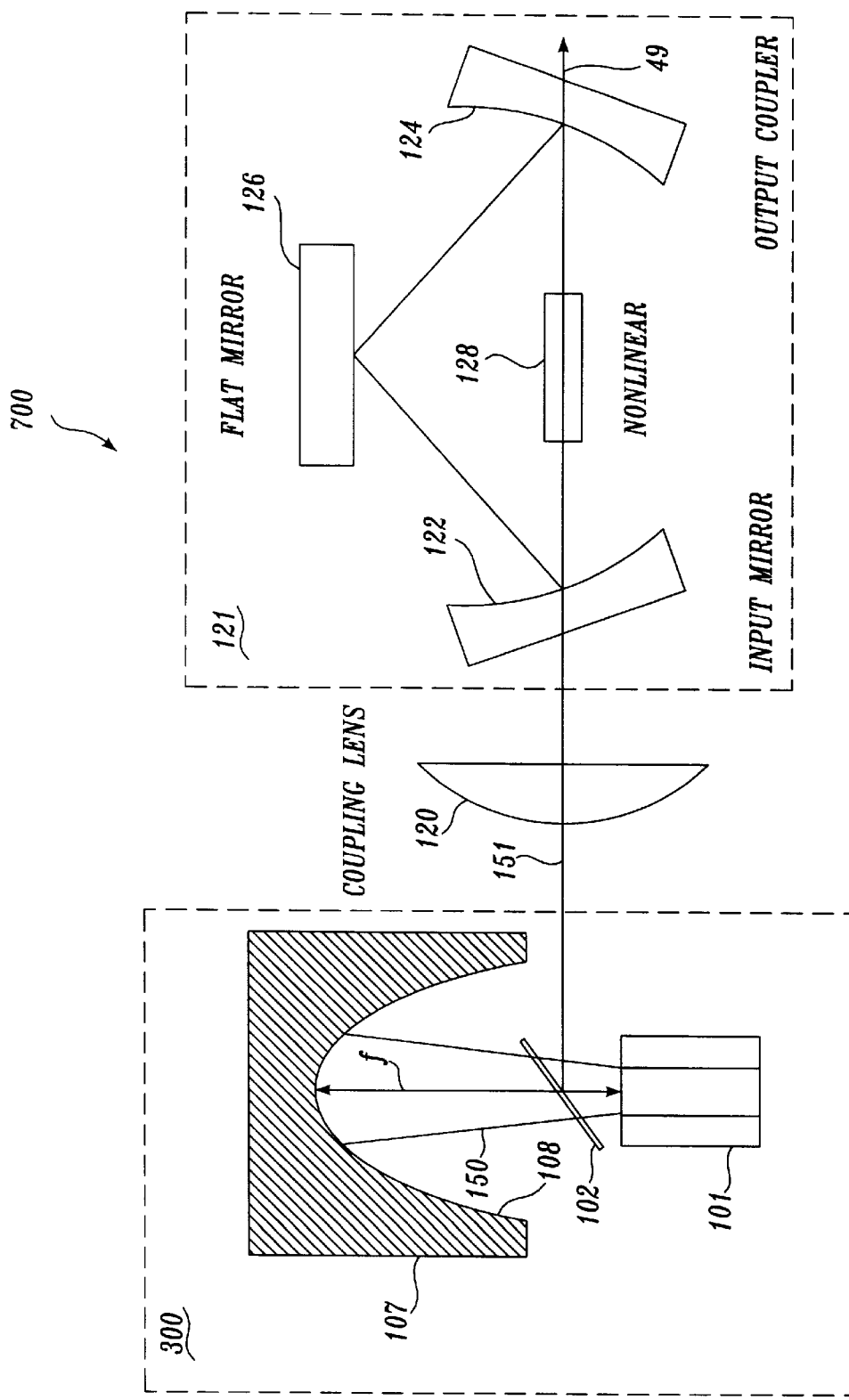
FIGS. 2A–2B are schematic illustrations of an embodiment of the laser source utilizing an external reflection feedback mechanism.
Figure 2B:
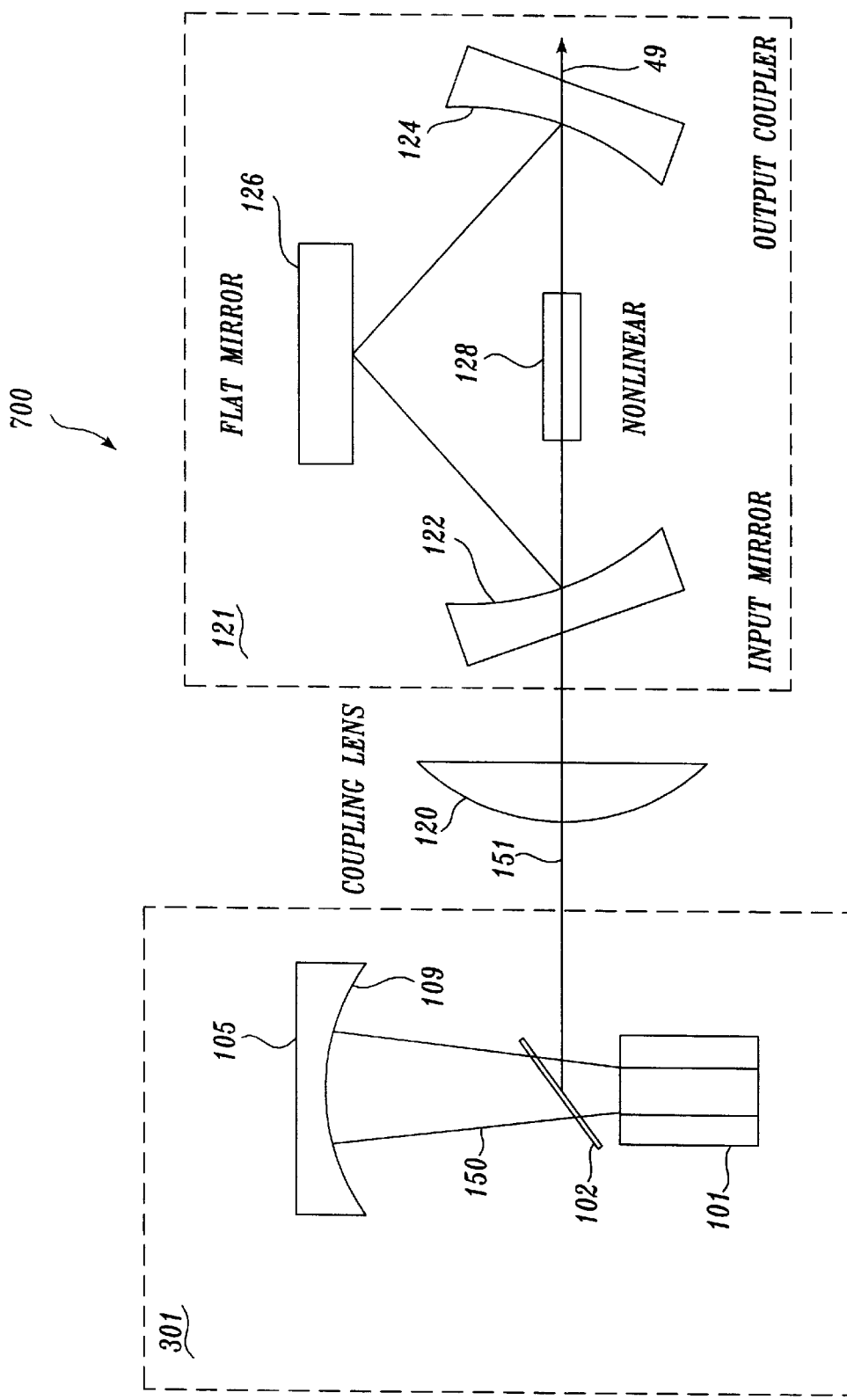

FIGS. 2A–2B are schematic illustrations of one embodiment of the present invention where the laser source 700 utilizes an external feedback mechanism 300 and 301 to improve the quality of the laser beam directed into a coupling lens 120 and a ring resonator 121. In this embodiment, the feedback mechanism alternatively utilizes reflective optical members 105 and 107 to produce optical feedback that improves the quality of the laser beam. More specifically, the external optical reflector members 105 and 107 create a laser light beam that has a normal curve, for example, a Gaussian or quasi-Gaussian profile. These profiles provide a high degree of redistribution of the original signal in its feedback, i.e., the feedback is not at all proportional to the original signal, to discourage the filamentary behavior of the output of the broad-area laser diode. Other curved surfaces such as a spherical profile can also provide a certain level of mode control. A Gaussian beam has many desirable qualities with one being that a Gaussian beam can be manipulated to be an eigenmode of an optical cavity with finite-size spherical mirrors. Other benefits utilizing an external optical reflector are further described in U.S. Pat. No. 6,002,703 to Hwu et al., entitled "Gaussian Profile Promoting Cavity For Semiconductor Laser," the disclosure of which is specifically incorporated herein by reference.

The laser source 700 depicted in FIG. 2A comprises a semiconductor laser 101, an external optical reflector 107, a beam splitter 102 a nonlinear crystal 128 and a plurality of mirrors 122–126 that are operatively arranged to create a ring resonator 121. The optical reflector 107 preferably has a substantially parabolic cavity 108. The optical reflector 107 is oriented such that parabolic cavity 108 faces the aperture 51 of semiconductor laser 101. The semiconductor laser 101 is positioned so that aperture 51 is located at the focal point "f" of parabolic cavity 108. The external optical reflector 101, beam splitter 102 and semiconductor laser 101 are collectively referred to herein as a Gaussian optical device 300.

The optical reflector 107 is a cylindrical parabolic reflector, with the parabolic cavity 108 having a mirrored surface that reflects a large amount of the light emitted by semiconductor laser 101. The optical reflector 107 can be formed of various materials such as metals, plastics, glass, or combinations thereof in order to produce a mirrored surface that is highly reflective. For example, a layer of a suitable reflective metal can be formed on the parabolic surface of optical reflector 107 to produce a mirrored surface. Suitable reflective metals include nickel, gold, aluminum, a ceramic material or other reflective metals.

The beam splitter 102 is positioned between semiconductor laser 101 and optical reflector 107 at a location such that a beam 150 is incident on the beam splitter 102. The beam splitter 102 is oriented at a suitable angle in order to deflect a portion of the reflected light from optical reflector 107 away from the Gaussian optical device 300. For example, the beam splitter 102 can be at an angle of about 45° with respect to the direction of light propagation, i.e., the z direction shown in FIG. 1A. The beam splitter 102 can be formed of light transmissive materials such as various plastics or glass. In addition, a variety of conventional optical coatings or layers are optionally applied to the surfaces of beam splitter 102 to produce the desired reflectivity, transmissivity, or deflection properties for a particular application.

During operation of the laser source 100, the semiconductor laser 101 emits a diverging beam 150 that is incident upon the beam splitter 102 and the optical reflector 107. The beam 150 is reflected back towards the beam splitter 102 and the facet (51 of FIG. 1A) of semiconductor laser 101. A portion of the beam 150 is transmitted back through the beam splitter 102 toward the facet 51 to produce an optical feedback effect. The remaining portion of beam the 150 is deflected by the beam splitter 102 at an angle of about 90° with respect to the direction of light propagation, i.e., the z direction shown in FIG. 1A. The portion of the beam 151 which is deflected by the beam splitter 102 has substantially reduced or no filamentation.

The corrected laser beam 151 of the Gaussian optical device 300 is directed into a coupling lens 120 and the ring resonator 121. The coupling lens 120 is used to focus the beam onto the input mirror 122 of the ring resonator 121, and the ring resonator 121 allows for enhancement of the fundamental power inside the nonlinear crystal 128. This structure provides increased conversion efficiency from the infrared input laser to the blue or green output laser 49 and resultant higher second harmonic power. This embodiment of FIG. 2A utilizes the external optical reflector 107 having a parabolic cavity 108 in combination with the ring resonator 121 and nonlinear crystal 128 for generating a blue or green light laser from a high-power infrared diode laser.

As shown in FIG. 2A, the ring resonator 121 is used to concentrate the laser beam into a nonlinear crystal 128 to generate a second harmonic signal of a blue or green light laser. The ring resonator 121 comprises an input mirror 122, an output coupler 124, and a highly reflective flat mirror 126. As shown in FIG. 2A, the input mirror 122, the flat mirror 126, and the output coupler 124 define a triangular path for the 980 nm laser such it passes through the nonlinear crystal 128 and reflects a light beam back and forth through the nonlinear crystal 128. An infrared laser ring cavity is formed between the input mirror 122 and the output coupler 124, to allow for the extraction of a blue or green light laser power.

The output coupler 124 is specially coated to allow the output beam 49 of a predetermined wavelength to pass therethrough. More specifically, the flat mirror 126, input mirror 122 and the output coupler 124 are nearly one-hundred percent reflective at wavelengths equal to 980 nm, while the output coupler 124 is configured to pass most of the second harmonic. In one embodiment, the output coupler 124 has a near zero percent reflectivity at wavelengths approximate to 490 nm. The input mirror 122 and the output coupler 124 are both configured to have matching curvatures.

The ring resonator 121 directs the laser beam so that it has multiple passes through the nonlinear crystal for a higher output power, e.g., a power in the tens of milliwatts. At this power level, applications such as data storage or compact disk storage can be accomplished.

The nonlinear crystal 128 can be made with materials such as lithium tantalate, potassium titanyl phosphate, lithium niobate, vandadate, other like materials. In this exemplary embodiment, the nonlinear crystal 128 has a diameter of a 3 millimeters and a length of approximately 10 millimeters. Although this exemplary embodiment is sized with these dimensions, the size of the nonlinear crystal 128 can vary, e.g., the diameter and length can vary up to a few millimeters.

FIG. 2B illustrates another embodiment of the present invention utilizing an external optical reflector 105 having a non-planar cavity 109. The laser source 100 depicted in FIG. 2B comprises a structure similar to the laser source illustrated in FIG. 2A and described above, except that the external optical reflector 105 comprises a non-planar cavity 109 having diffractive optics rather than a curved (for example, parabolic shape). The diffractive optics includes traditional grating devices of all types (diffraction grating, blazed diffraction grating, volume holographic transmission grating, etc.) and advanced diffractive optics such as continuous surface-relief diffractive optics and digital/binary optics. The stability limit of the output laser 151 drops rapidly with decreasing reflectivities of the external feedback. Thus, reflectivity values of the diffractive optical reflector should remain well above 50 percent because the lateral modes become uncontrollable. The external optical reflector 105, the beam splitter 102 and the semiconductor laser 101 are collectively referred to herein as the non-planar cavity optical device 301.

Similar to the optical reflector 107 of FIG. 2A, the diffractive optical reflector 105 also has a mirrored surface that reflects a large amount of the light emitted by semiconductor laser 101. The diffractive optical reflector 105 can be formed of various materials such as metals, plastics, glass, or combinations thereof in order to produce a mirrored surface that is highly reflective. As described above with reference to FIG. 2A, a layer of a suitable reflective metal can be formed on the surface of diffractive optical reflector 105 to produce a mirrored surface. In this embodiment, the beam splitter 102 is positioned and configured in a manner similar to the beam splitter 102 described above with reference to FIG. 2A.

Similar to FIG. 2A, the corrected laser beam 151 from the non-planar cavity optical device 301 is directed into a coupling lens 120 and a ring resonator 121 similar to that shown in FIG. 2A. The embodiment depicted in FIG. 2B utilizes the external diffractive optical reflector 105 in combination with the ring resonator 121 and nonlinear crystal 128 for generating a blue or green light laser from a high-power infrared diode laser. As described in more detail below, the color of the laser emitted depends on the wavelength of the source. The choice of the nonlinear crystal 128 also influences the corresponding output light 49 wavelength.

Figure 3:
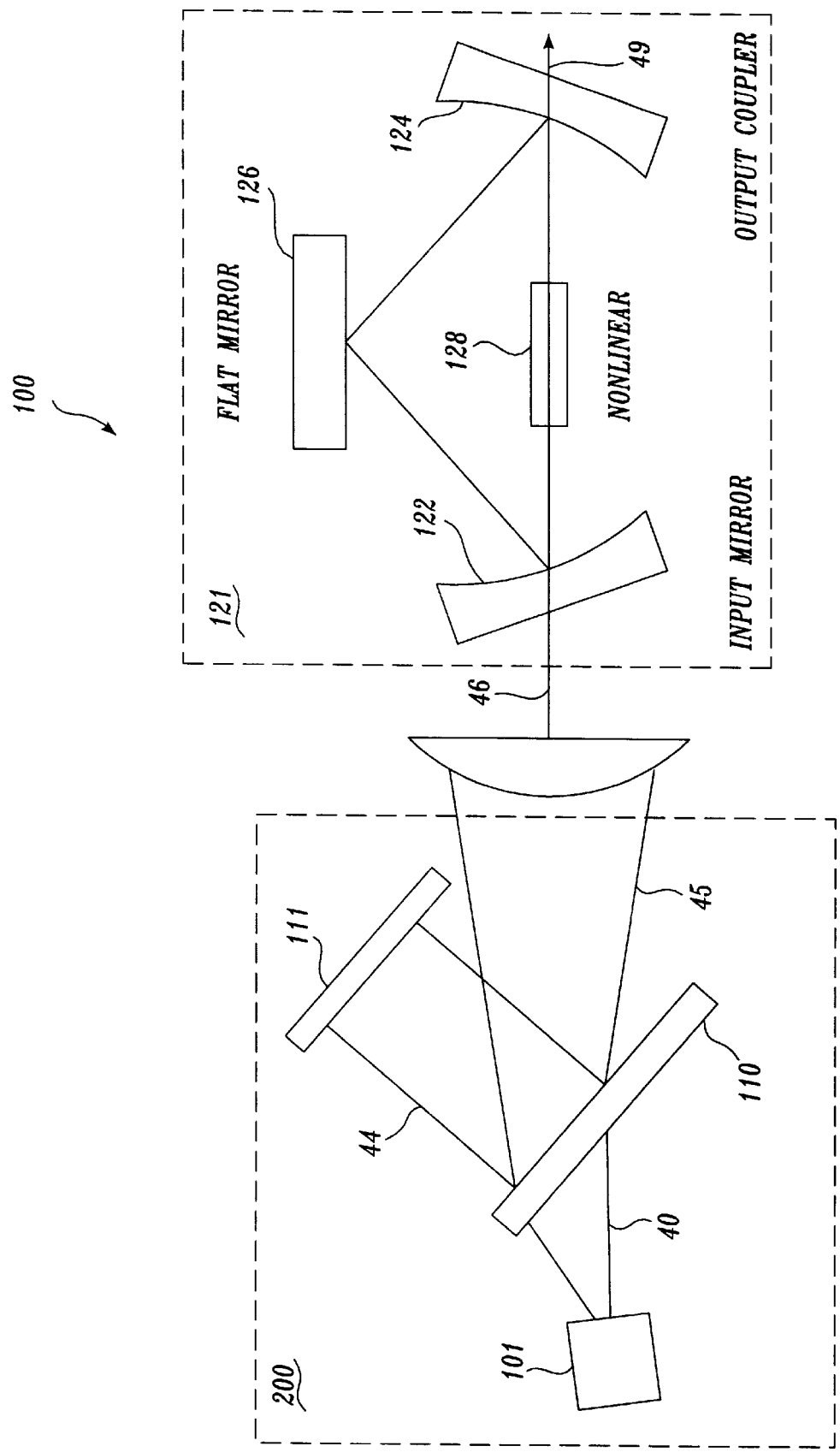
FIG. 3 is a schematic view of another embodiment of the laser source utilizing an external transmission feedback scheme such as a volume holographic grating.

FIG. 3 is a schematic view of a blue and green laser source 100 formed in accordance with yet another embodiment of the present invention. Depending on the configuration, the laser source 100 can produce a stable, high-power, single-mode blue (for example 490 nm) laser beam from a single source semiconductor laser having a wavelength of 980 nm. The laser source 100 comprises a semiconductor laser 101, a volume holographic transmission grating (VHTG) 110, a high-reflectivity mirror 111, a coupling lens 120, a nonlinear crystal 128, and a plurality of mirrors 122–126 that are operatively arranged to create a ring resonator 121. Optionally, a focusing (coupling) lens (not shown) can be placed between the semiconductor laser 101 and the volume holographic transmission grating 110. In this exemplary embodiment, the coupling lens 120 is placed at a distance from the semiconductor laser 101 equal to the focal length of coupling lens. The semiconductor laser 101, VHTG 110, and high-reflectivity mirror 111 are collectively referred to herein as a VHTG system 200.

As shown in FIG. 3, the volume holographic transmission grating (VHTG) 110 is positioned between the semiconductor laser 101 and the coupling lens 120 such that the VHTG 110 and the high-reflectivity mirror 111 function as a feedback mechanism to the semiconductor laser 101 and allows light to pass to the coupling lens 120. The high-reflectivity mirror 111 is positioned to receive the diffracted light from the VHTG 110, and functions to reflect the received light back to the VHTG 110. The VHTG 110 is constructed from a transparent material such as plastic or glass and may be configured with a grading of 900 grooves/mm.

The VHTG output beam 45 is received by a coupling lens 120, which focuses the output beam 46 into the ring resonator 121 (components 122–126). The ring resonator 121 is configured in a manner consistent with the constriction of FIGS. 2A and 2B and concentrates the corrected laser beams 46, having better spatial mode, into a nonlinear crystal 128, which in turn, produces a green or blue output beam 49. As noted above, the wavelength of the source laser determines the color of the laser. For green light generation, the laser source may have a wavelength of approximately 1000 nm and a nonlinear crystal may be Potassium Titanium Oxide Phosphate (KTP), Lithium Triborate (LBO), or other like materials. For blue light generation, the laser source may have a wavelength of approximately 900 nm and the nonlinear crystal may be Lithium Triborate (LBO), Ammonium Dihydrogen Phosphate (ADP), ADTP, or other like materials. In the embodiment of FIG. 3, tuning is achieved by rotating the high-reflectivity mirror 111 and the diffractive optical reflector 105, respectively. When the high-reflectivity mirror 111 and the diffractive optical reflector 105 are tilted, the feedback beam will enter the semiconductor laser 101 (100 μm width) at different incident angles, thereby changing the spatial output.

Figure 4:
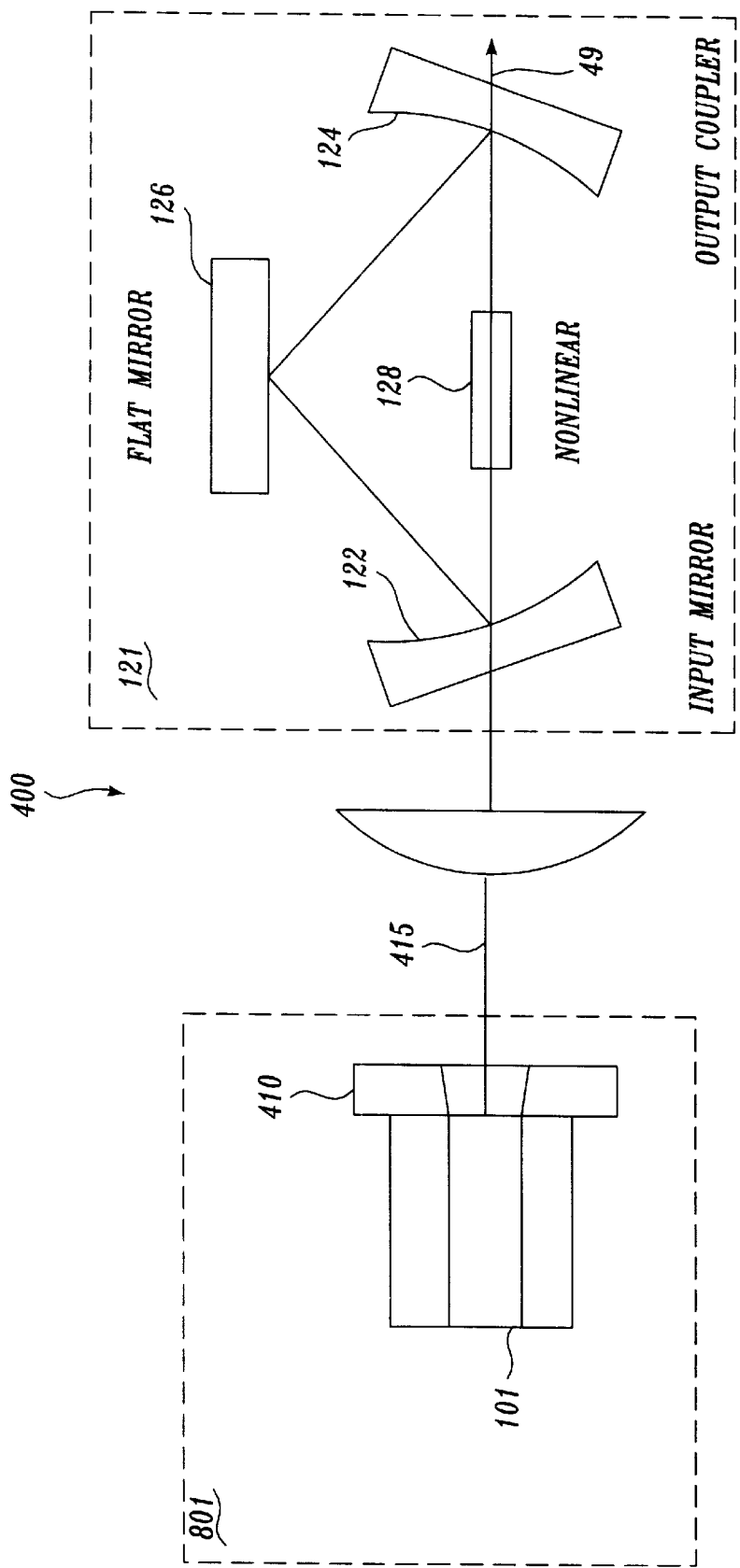
FIG. 4 is a schematic illustration of another embodiment of the present invention utilizing a diffractive optics member attached to the semiconductor laser to provide feedback.

FIG. 4 is a schematic illustration of another embodiment of the present invention shown in FIGS. 2A, 2B and 3 which uses a diffractive optics member 410 to improve the quality of the laser beam 415 directed to the coupling lens 120. For example, the diffractive optics member 410 may be a digital diffractive optics device attached to the semiconductor laser 101 and used to generate a corrected laser beam 415 that is directed to a coupling lens 120 and a ring resonator 121.

This embodiment of the laser source 400 includes semiconductor laser 101, an external diffractive/digital optics member 410 positioned adjacent to semiconductor laser 101, an optional coupling lens 120, a ring resonator 121, and a nonlinear crystal 128. The ring resonator 121 and nonlinear crystal 128 are configured in a manner that is consistent with the construction of FIGS. 2A, 2B, and 3. The diffractive/digital optics member 410 behaves as a feedback device, which is contiguous with the facet (51 of FIG. 1A) of semiconductor laser 101. This embodiment with the digital optics member 410 follows the general concept of the non-planar feedback. More specifically, the diffractive/digital optics member 410 redistributes the output of the semiconductor laser 101 in the feedback. The external diffractive/digital optics member 410 and semiconductor laser 101 are collectively referred to herein as the external digital optics laser source 801.

Figure 5:
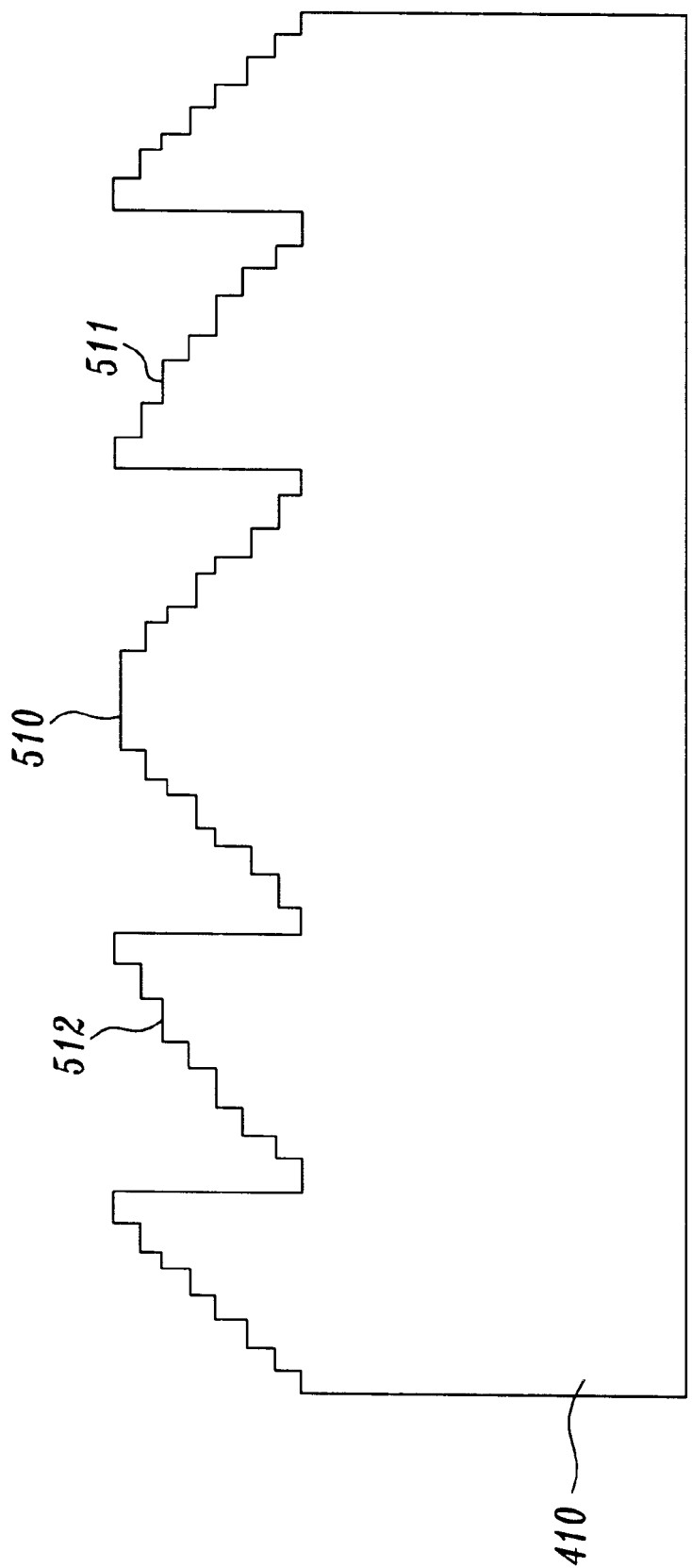
FIG. 5 is an enlarged cross-sectional view of the external digital optics member utilized in the embodiment illustrated in FIG. 4.

FIG. 5 is an enlarged view of the external diffractive optics member 410 (in the form of digital optics) showing a surface 510 which has been etched to produce a plurality of steps 512 such that it provides the source with a feedback which is not directly proportional to the original signal (the signal is redistributed). This feedback discourages the formation of filamentation and allows for single mode operation. The profile produced by a diffractive optical reflector, as described above with reference to FIG. 2B, is realized on a planar surface by etching steps into the surface material to approximate the slope required for constituting the desired profile.

The diffractive/digital optics member 410 is formed of conventional materials that render it semi-reflective so as to reflect a portion of the emitted light back to the facet 51 of the semiconductor laser 101 and transmit the remaining portion of light therethrough. The diffractive/digital optics member 410 has a transmissivity of up to about 50%, or a reflectivity of at least about 50%. The diffractive/digital optics member 410 is formed of light transmissive materials such as various plastics or glass. A variety of conventional antireflective coatings or layers can be applied to the surfaces of the diffractive/digital optics member 410 to produce the desired reflectivity or transmissivity properties for a particular application.

As shown in FIG. 4, the present invention uses different diffractive optics, e.g., diffractive optics member 410, such as diffraction gratings of both transmissive and reflective types, advanced digital/binary optics and continuous surface-relief diffractive optics to improve the quality of the laser beam directed to the coupling lens 120. One example of a transmissive grating is a volume holographic transmission grating such as that shown in FIG. 3. Examples of reflective gratings include linear and blazed diffraction gratings. For advanced diffractive optics, both transmissive and reflective types of optics can be fabricated for digital/binary optics and continuous surface-relief diffractive optics through different reflection/antireflection coating.

Figure 6:
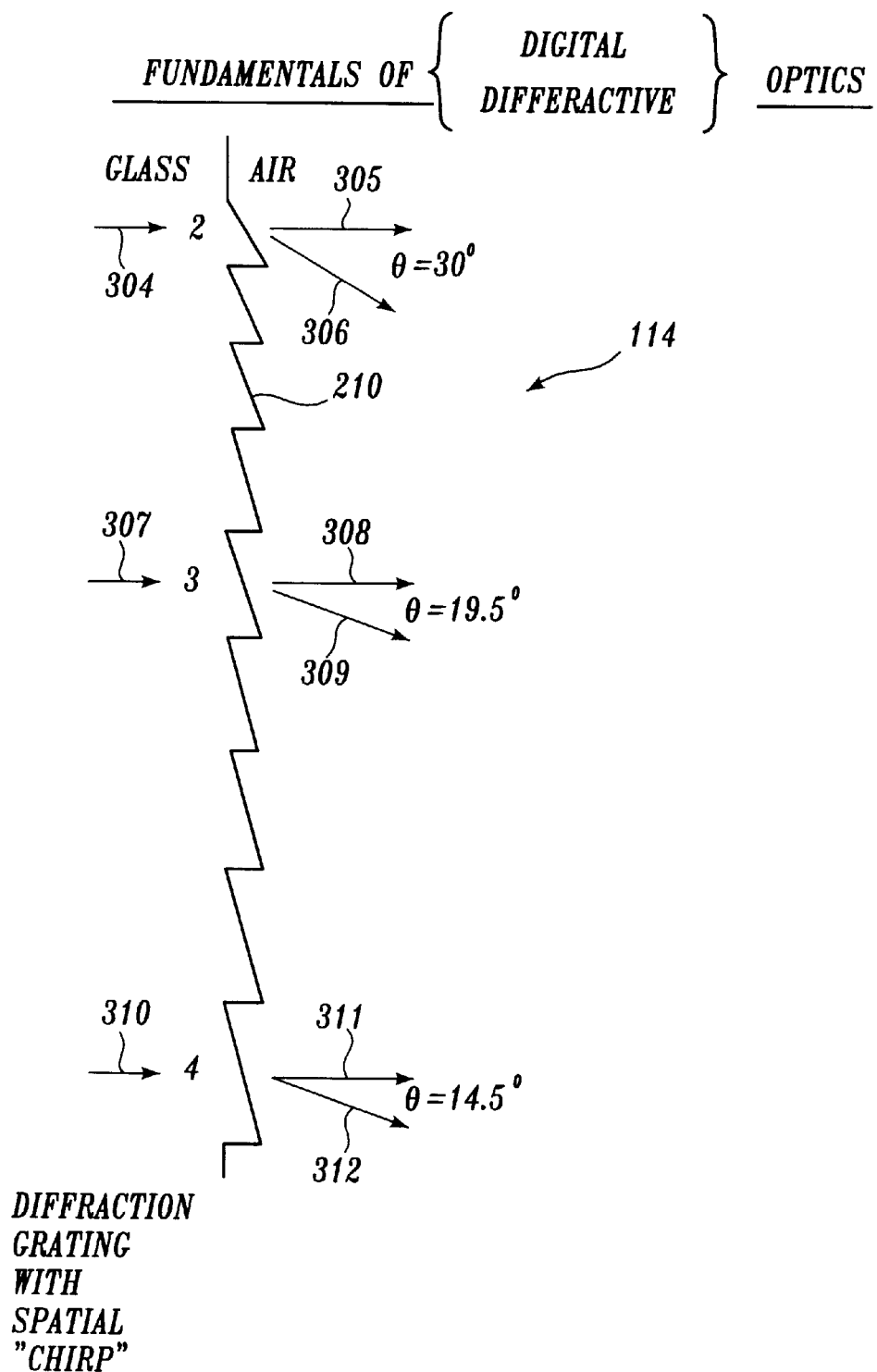
FIG. 6 is a side view of a traditional blazed diffraction grating as a non-planar surface to provide redistribution of the light in the feedback.

FIG. 6 is a side view of a blazed diffraction grating 114, a device that can be used for mode-controlling of a high-power laser source by providing feedback which is not directly proportional to its original signal. As shown in FIG. 6, angled ridges cut into the glass are configured to spread the light as it exits the surface of the diffraction grating 114. For instance, when the beam near the top of the device 304 exits the diffraction grating 114, it is redirected at an angle approximate to 30° from the beams original path 304. Also shown in FIG. 6, other etchings are created to redirect the light at other angles, such as, beam 307 having a redirection of approximately 19.5°, and beam 310 having a redirection of approximately 14.5°.

Figure 7A:
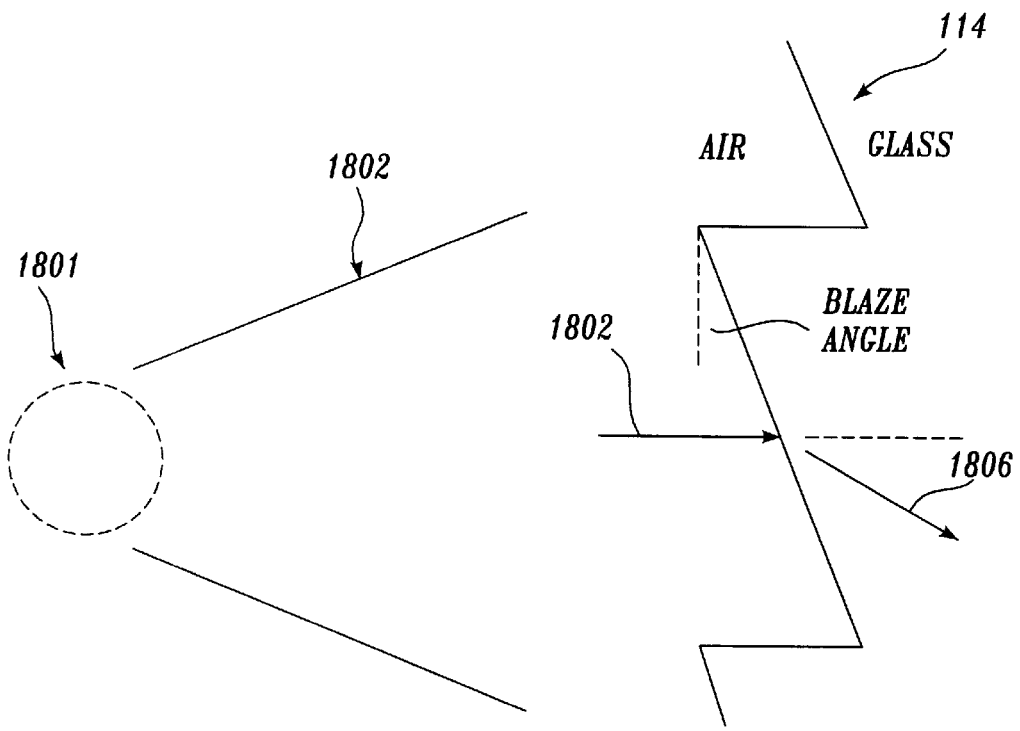
FIGS. 7A and 7B illustrate the evolution of a traditional blazed diffraction grating into a binary/digital optical device.
Figure 7B:
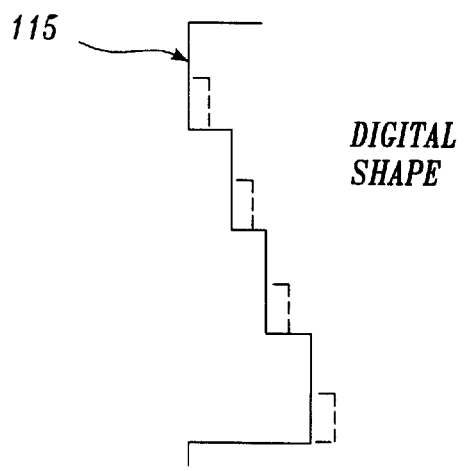

FIGS. 7A and 7B illustrate how the blazed diffraction grating 114 having blazed gratings can be substituted by the use of binary etchings in a binary optics device 115. As shown in FIG. 7B, squared groves are created in the glass surface such that it will resemble the same sloped surface of the blazed diffraction grating 114. As the uncorrected light 1802 enters the grating 114 from the light source 1801, the entered light 1806 is redirected at a predetermined angle. The digital shapes of the binary optics device 115 are configured in the same manner as the traditional diffraction grating 114, only the angled surfaces are cut by small semi-rectangular angles.

The percentage of the incident light redirected by the desired angle is referred to as the diffraction efficiency. The diffraction efficiency of a diffractive element is determined by the clement's surface profile. If the light that is not redirected by the desired angle is substantial, the result will be an intolerable amount of scatter in the image or output plane of the optical system. Fortunately, a surface profile exists, in theory, that achieves 100-percent diffraction efficiency at a specific wavelength. This is exemplified in the redirection of light, as illustrated in FIG. 6. The theoretical diffraction efficiency of this surface profile is also relatively insensitive to a change in wavelength. This profile could therefore be used in optical systems operating over finite wavelength bands. The theoretical existence of a surface profile having high diffraction efficiency has no practical consequences in the design of optical systems unless this profile can be easily determined and readily fabricated. It is possible to fabricate diffractive phase profiles that approximate the ideal diffractive profile through gray-scale mask continuous surface-relief diffractive optics technique. In addition, the ideal profile can be approximated in a discrete fashion, similar to the binary representation of an analog function, as shown in FIG. 7B. Exemplary analog functions of preferred laser light patterns are modeled in a series of equations described in more detail below.

Returning to FIG. 4, during operation of laser source 400, semiconductor laser 101 emits a diverging beam that is incident upon the diffractive/digital optics member 410. The diffractive/digital optics member 410 provides feedback to the laser source 101 that is not directly proportional to its original signal to discourage the formation of filamentation. The beam 415 which transmits through diffractive/digital optics member 410 has substantially reduced or no filamentation.

The following equation models are provided for the purposes of providing a more detailed description of the corrected laser beam produced by the external feedback mechanisms 300, 301, 200 and 801 shown in FIGS. 2A, 2B, 3, and 4, respectively. For a semiconductor laser 101 of length L and stripe width w, such as shown in FIG. 1A, operating continuously at some pumping current density J(x,z), the propagation of the beam inside the active layer 50 is modeled by the following wave equations (1a and 1b):

$$\frac{\partial E_f}{\partial z} = \tag{1a}$$

$$\frac{i}{2k} \frac{\partial^2 E_f}{\partial x^2} + \left[\frac{1}{2}\Gamma(1-i\alpha)g(N) - \frac{\alpha_{int}}{2} + in_2 k_0 (|E_f|^2 + 2|E_b|^2)\right] E_f$$

$$-\frac{\partial E_b}{\partial z} = \tag{1b}$$

$$\frac{i}{2k} \frac{\partial^2 E_f}{\partial x^2} + \left[\frac{1}{2}\Gamma(1-i\alpha)g(N) - \frac{\alpha_{int}}{2} + in_2 k_0 (|E_b|^2 + 2|E_f|^2)\right] E_b$$

where $E_f$ is the forward traveling wave, $E_b$ is the backward traveling wave, $\Gamma$ is the transverse confinement factor, $\alpha$ is the linewidth-enhancement factor, $\alpha_{int}$ is the internal loss, $n_2$ is the Kerr coefficient, and $g(N)=\beta(N-N_0)$ is the local carrier-dependent gain, which is linearly related to the carrier density N(x,z).

For a broad area laser with a very thin active gain layer, the carrier density distribution N(x,z) can be solved from the following equation (2):

$$D\frac{\partial^2 N(x,z)}{\partial x^2} = -\frac{J(x,z)}{qd} + \frac{N(x,z)}{\tau_{in}} + BN^2(x,z) + \frac{\Gamma g(N)}{\hbar w}(|E_f|^2 + |E_b|^2) \tag{2}$$

The above equations can give the whole picture of the beam propagation inside the laser gain region, located in the active layer (50 of FIG. 1A). With the use of an external cavity, the boundary conditions are defined by the following equations (3a and 3b):

$$E_f(x,0) = \sqrt{R_0}E_b(x,0) + \int E_b(x,0)\exp(i\phi_b(x,x'))dx' \tag{3a}$$

$$E_b(x,0) = \sqrt{R_0}E_f(x,0) + \int E_f(x,0)\exp(i\phi_f(x,x'))dx' \tag{3b}$$

where the second term stands for the reflecting beam from the external cavity and φ(x,x') is the phase change between the point x and the reflected point x'. Generally, φ(x,x') carries a very complex expression. For a Gaussian profile cavity, φ(x,x') has a quadratic form and is equal to $-\alpha(x-x')^2$, where $\alpha$ is proportional to the focal length of the Gaussian cavity, such as the parabolic mirror shown in FIG. 2A.

The wave equations (1a and 1b) are solved iteratively by the split-step Fourier method. For every iteration, the forward and backward traveling beams are calculated using the fast Fourier transform (FFT) algorithm described in Agrawal, J. Appl. Phys., vol. 56, pp. 3100–3109 (1984), the disclosure of which is herein incorporated by reference. At the facets, the two beams are related by the boundary conditions. The integration across the boundary area is carried out each time. The carrier density distributions are solved through a tridiagonal matrix method using the finite-difference approximation of the second order derivative term.

The stopping criterion is taken as that the sum of the squares of the changes in the E field over the two facets from one iteration to the next is smaller than a prescribed tolerance (tol). When the code stops based on this criterion, then the solution is converging and stable. When the result failed to converge after a lot of iterations, the output of the laser is viewed as unstable, and corresponding to, physically, a snapshot at some time after the relaxation oscillation transients had died out. FIG. 5 is a table listing the parameter values used in the above numerical simulations. It should be noted that the simulation is initialized by using a cosine lateral profile at z=0.

Figure 9:
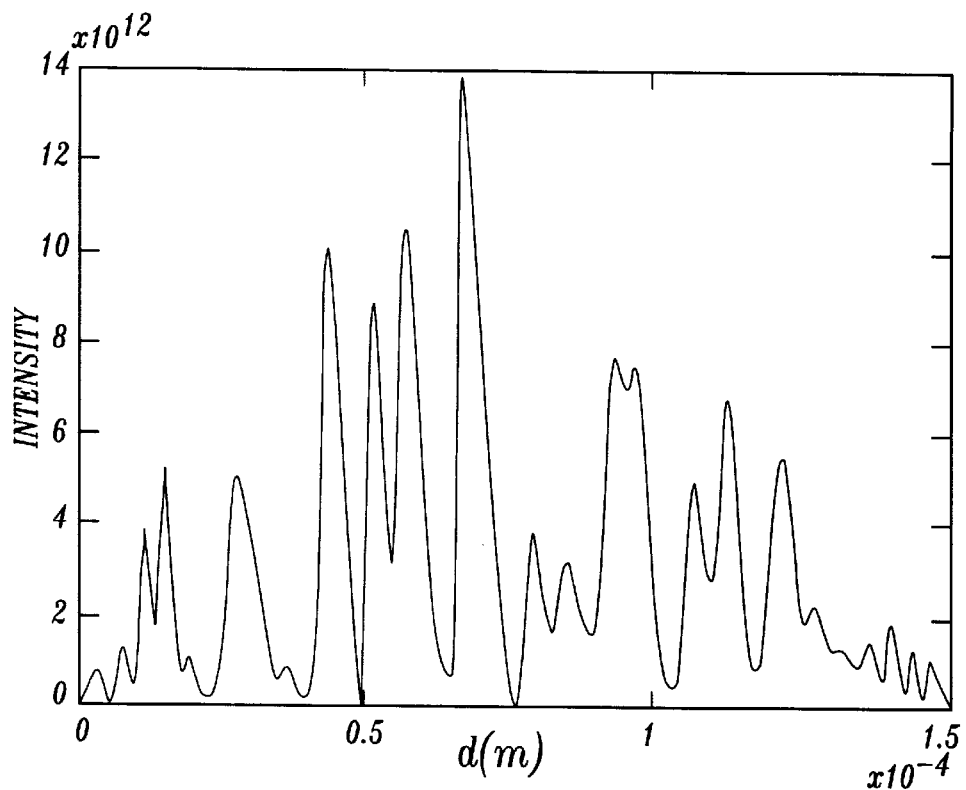
FIG. 9 shows a graph of the near-field intensity profile generated by a simulation for a broad-area semiconductor laser without an external cavity.

FIG. 9 shows a graph of the near-field intensity profile that is generated using the above numerical simulation for a broad-area semiconductor laser without an external cavity, such as shown in FIG. 1B. FIG. 9 illustrates the filamentation problem in the form of high peaks and near-zero valleys, which preclude a well-focused, high intensity beam. The numerous high peaks shown in the graph indicate the multiple modes of the laser.

Figure 10:
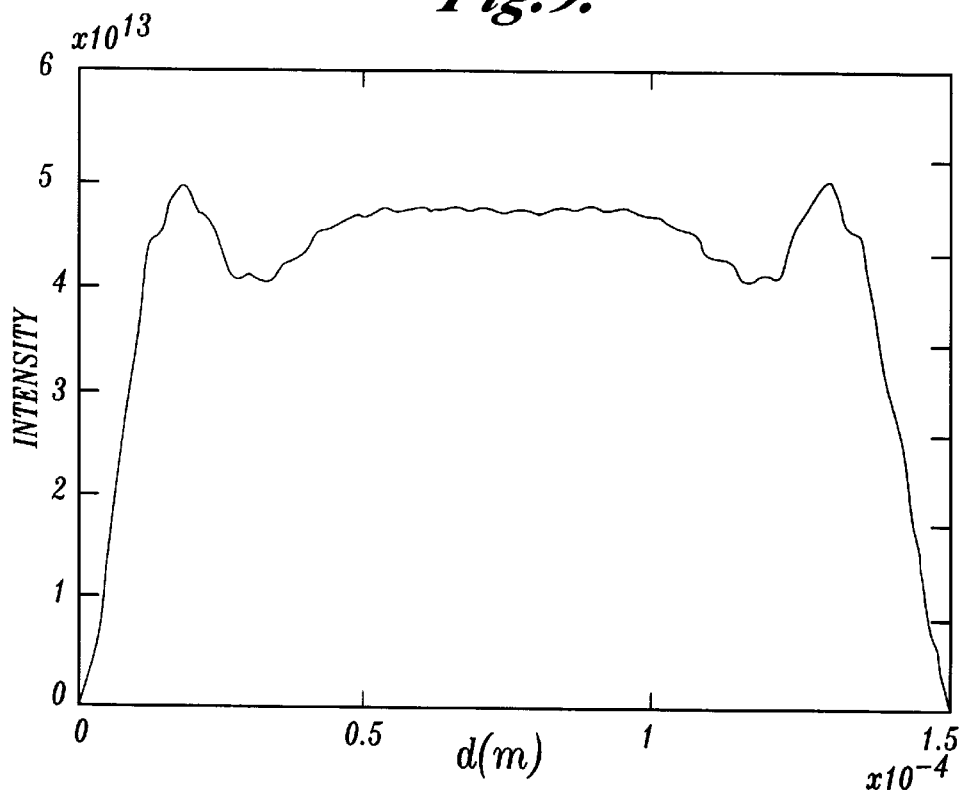
FIG. 10 shows a graph of the near-field intensity profile generated by a km simulation for a broad-area semiconductor laser utilizing an optical external cavity.

FIG. 10 shows a graph of the near-field intensity profile that is generated using the above numerical simulation for a broad-area semiconductor laser with the feedback optics shown in FIG. 2A, with the focal length (f) of the cavity at 15 mm. Both semiconductor lasers are considered as operating at the injection current level of $I=20I_{th}$. FIGS. 9 and 10 show the intensity of the beam across the diameter (d) of the beam. These graphs demonstrate that the near-field pattern is improved and the filamentary behavior is substantially reduced by using the Gaussian profile cavity according to the present invention. Other exemplary models of the corrected laser beam are described in U.S. Pat. No. 6,002,703 to Hwu et al., entitled "Gaussian Profile Promoting Cavity For Semiconductor Laser," the disclosure of which is specifically incorporated herein by reference.

As described with reference to the above described embodiments, high-power semiconductor lasers have a very deteriorated beam quality since the one way to achieve high power is to allow the diode lasers to oscillate with multiple modes, instead of a single mode. Also described above, multi-mode output of a high-power diode laser is difficult to control. For example, high power can be achieved by the use of broad area lasers which possess laterally wide gain regions. Although broad area lasers may operate in the fundamental lateral mode for pump levels close enough to threshold, the spatial coherence and the spectral purity of the output beam are severely degraded as the pump level is increased. In addition, beam filamentation in broad area lasers has been observed for moderate pump levels. By the use of the above-described embodiments utilizing optical feedback, under appropriate feedback conditions, lateral mode selection and pattern stabilization of a high-power laser can be obtained.

Figure 11:
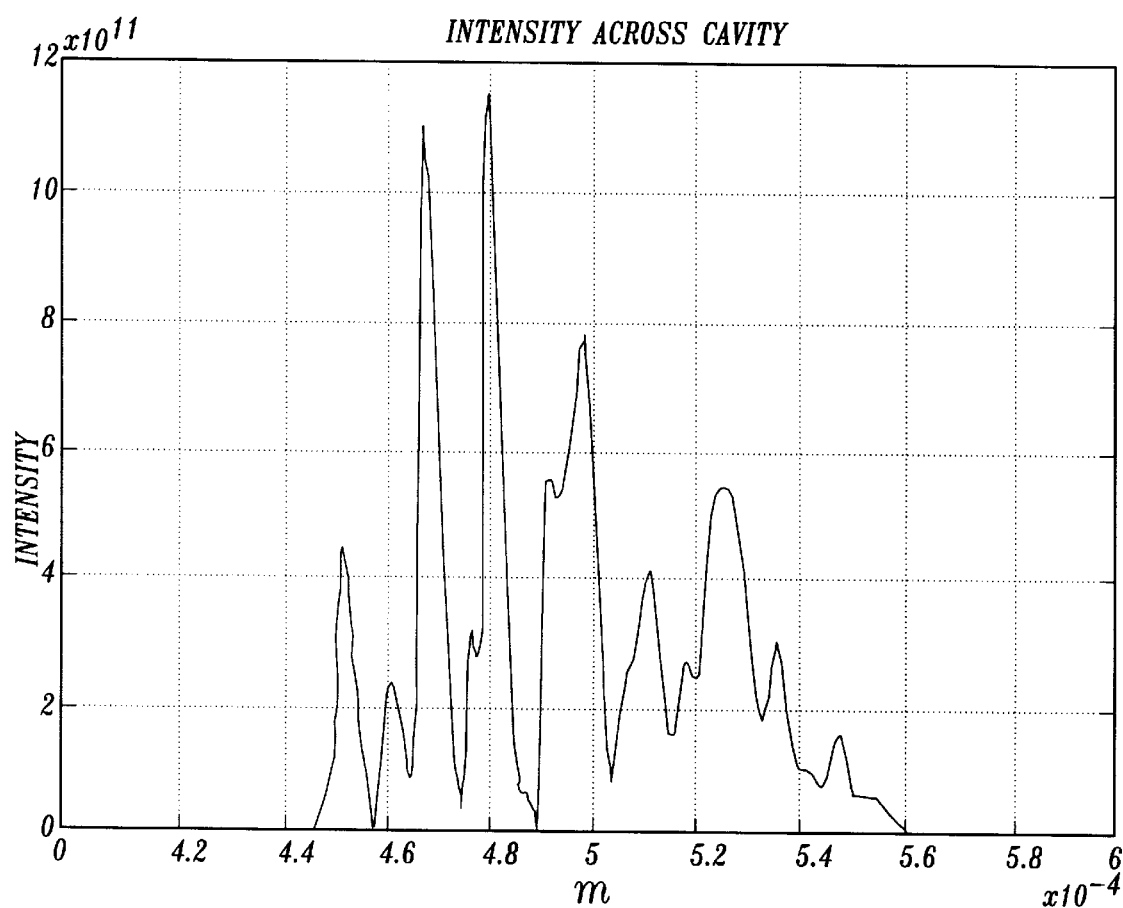
FIG. 11 is graph illustrating the intensity profile of a semiconductor laser beam without a feedback device.

FIG. 11 is another graph illustrating the intensity profile of a semiconductor laser beam without a feedback device. In this exemplary embodiment, the extremely broad area lasers enters in the multi-lateral mode regime for a pump level of $3I_{th}$, and in absence of a feedback device, has several, sometimes up ten, lateral modes present. If the above-described optical feedback embodiments are properly applied to the broad area laser, the mode selection and pattern stabilization are obtained.

Figure 12:
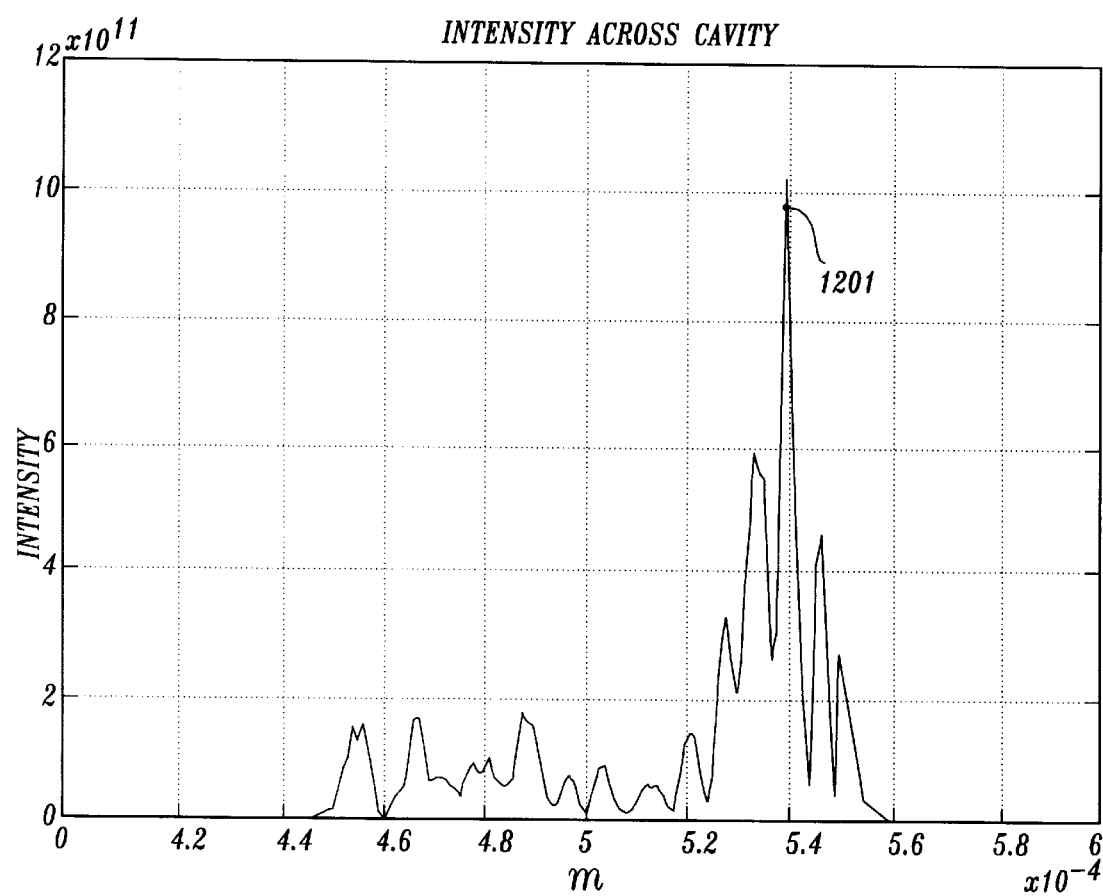
FIG. 12 is graph illustrating the intensity profile of the semiconductor laser beam having a traditional diffraction grating feedback device.

FIG. 12 is another graph illustrating the intensity profile of the sample semiconductor laser beam having a feedback device such as those shown in FIGS. 2B, 3 and 4. As shown in FIG. 12 and denoted by the node marked as item 1201, there is only one mode in the output laser, and the pattern of the laser is stabilized. FIGS. 11 and 12 are used to demonstrate that internal and external feedback employing conventional optics and binary optics are employed for successful and efficient lateral mode selection and pattern stabilization.

Figure 13:
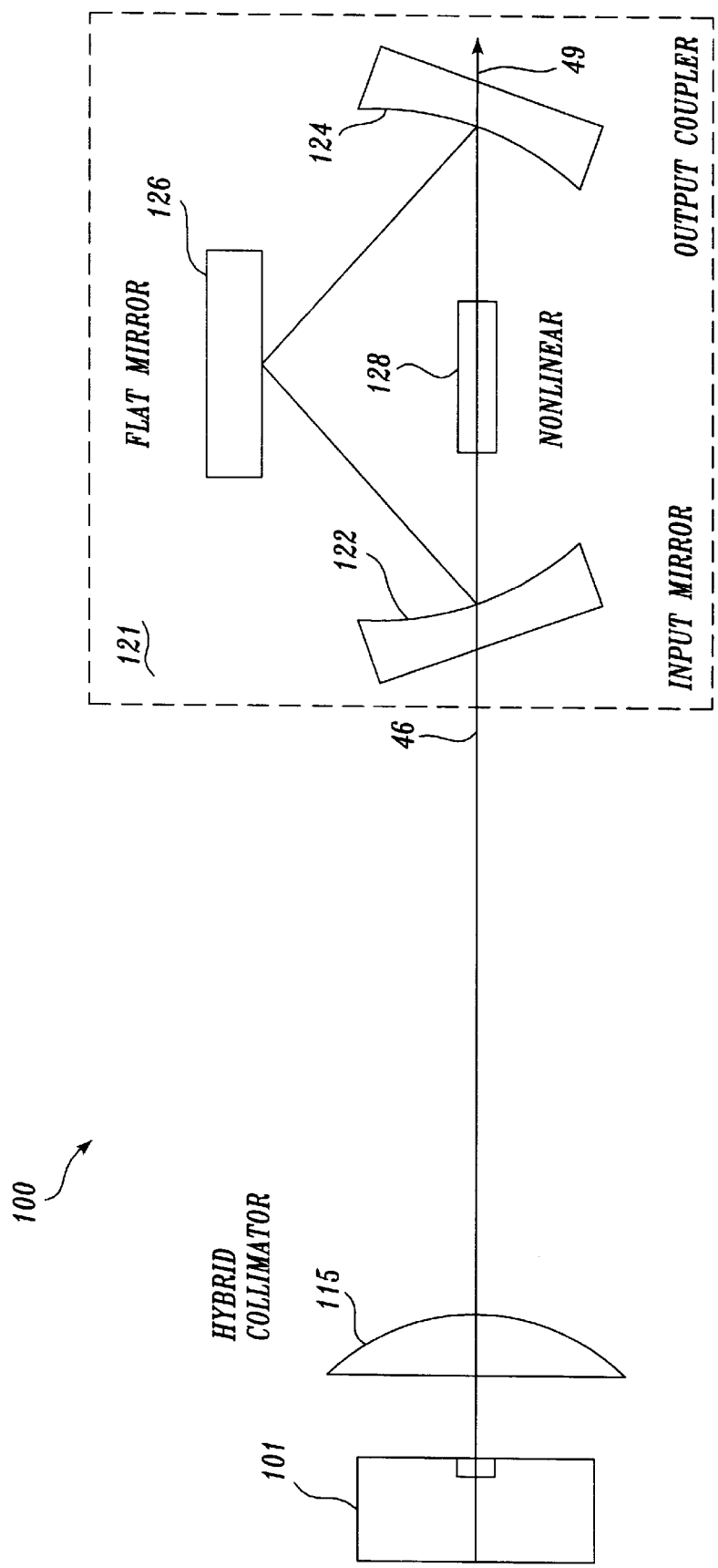
FIG. 13 is schematic illustration of an embodiment of the laser source utilizing a binary optics device as a focusing lens (coupler) without longitudinal spherical aberration.

FIG. 13 is schematic illustration of another embodiment of the laser source 100 shown in FIGS. 2A, 2B, 3, and 4 utilizing diffractive optics to correct the longitudinal spherical aberrations of the laser beam emitted from the semiconductor laser 101. The embodiment of FIG. 13 comprises a hybrid coupler 115, a ring resonator 121 (components 122–126), and a nonlinear crystal 128. In this embodiment, the ring resonator 121 and a nonlinear crystal 128 are configured in a manner similar to the embodiments of FIGS. 2A, 2B, 3, and 4. The purpose of the hybrid coupler 115 is to effectively focus the output beam from the semiconductor laser 101.

Figure 14:
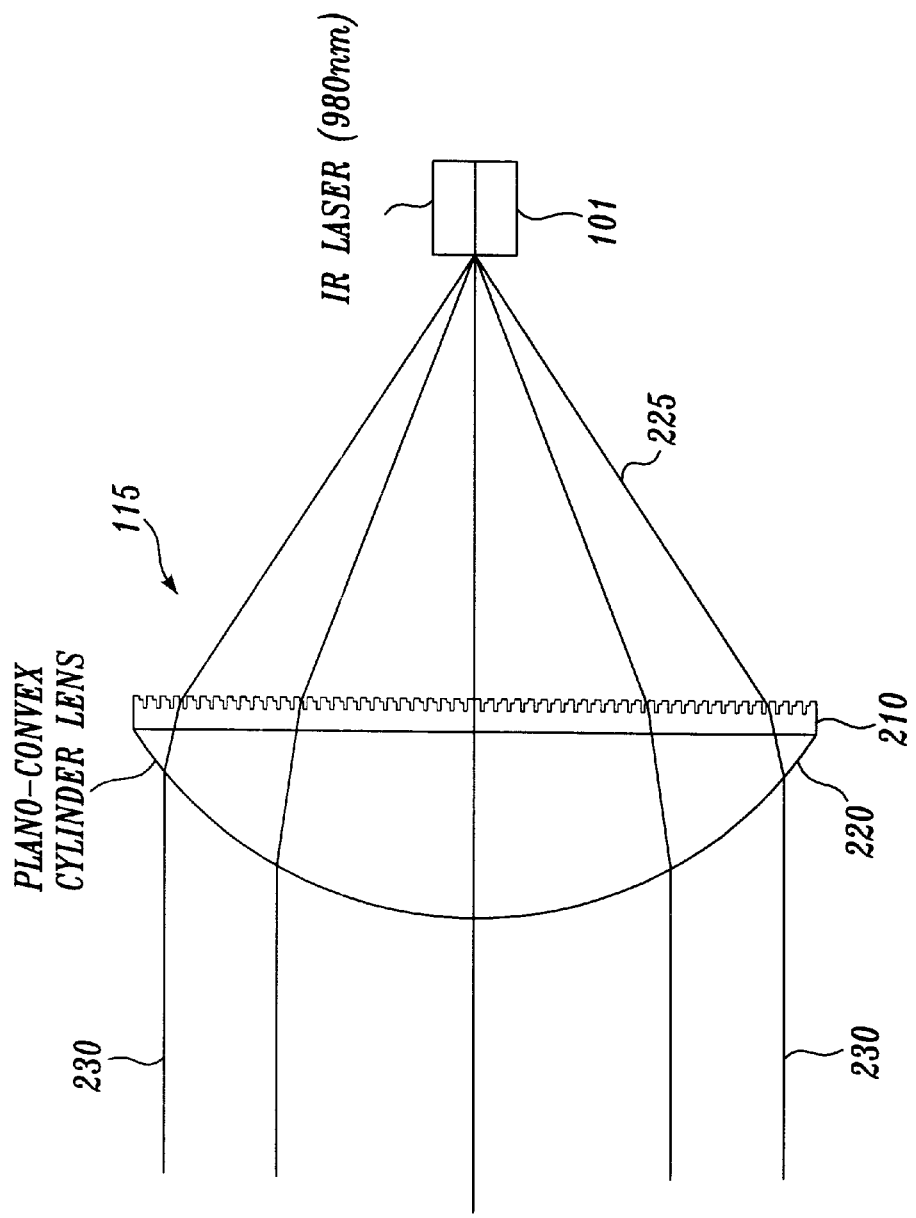
FIG. 14 is a blow-up side view of a hybrid focusing lens (coupler) utilized in the embodiment of FIG. 13.

FIG. 14 is a blow up side view of the hybrid coupler 115 having a diffractive optics device 210 and a Plano-Convex lens 220. The diffractive optics device 210 is used to assist the Plano-Convex lens 220 by correcting longitudinal spherical aberrations caused by the conventional Plano-Convex lens 220. Since as diffractive optic devices are able to correct phase fronts in arbitrary ways, the diffractive optics device 220 is designed to focus the beam of the high-power semiconductor laser 101 without longitudinal spherical aberration.

Specific to the structure of the diffractive optics 210 in binary format, the digital optics feature size becomes gradually finer moving from the center of the lens towards the outer edge. If the cylinder lens was not included and focusing was to be maintained, the binary optics feature size near the edges would be sub-micron. In one exemplary embodiment, the diffractive/digital optics device 210 is made from a separate sheet of transparent material having the binary etchings. The diffractive/digital optics device 210 is then fused onto the flat side of a Plano-Convex lens 220, such that light is able to pass through the Plano-Convex lens 220 and diffractive/digital optics device 210 as shown in FIG. 14. In an alternative embodiment, the binary optics pattern can be etched directly onto the flat side of the Plano-Convex lens 220. The binary etchings on the Plano-Convex lens 220 are configured to correct the longitudinal spherical aberrations caused by the curved edge of the Plano-Convex lens 220 and to focus the beam from the semiconductor laser 101.

Figure 15:
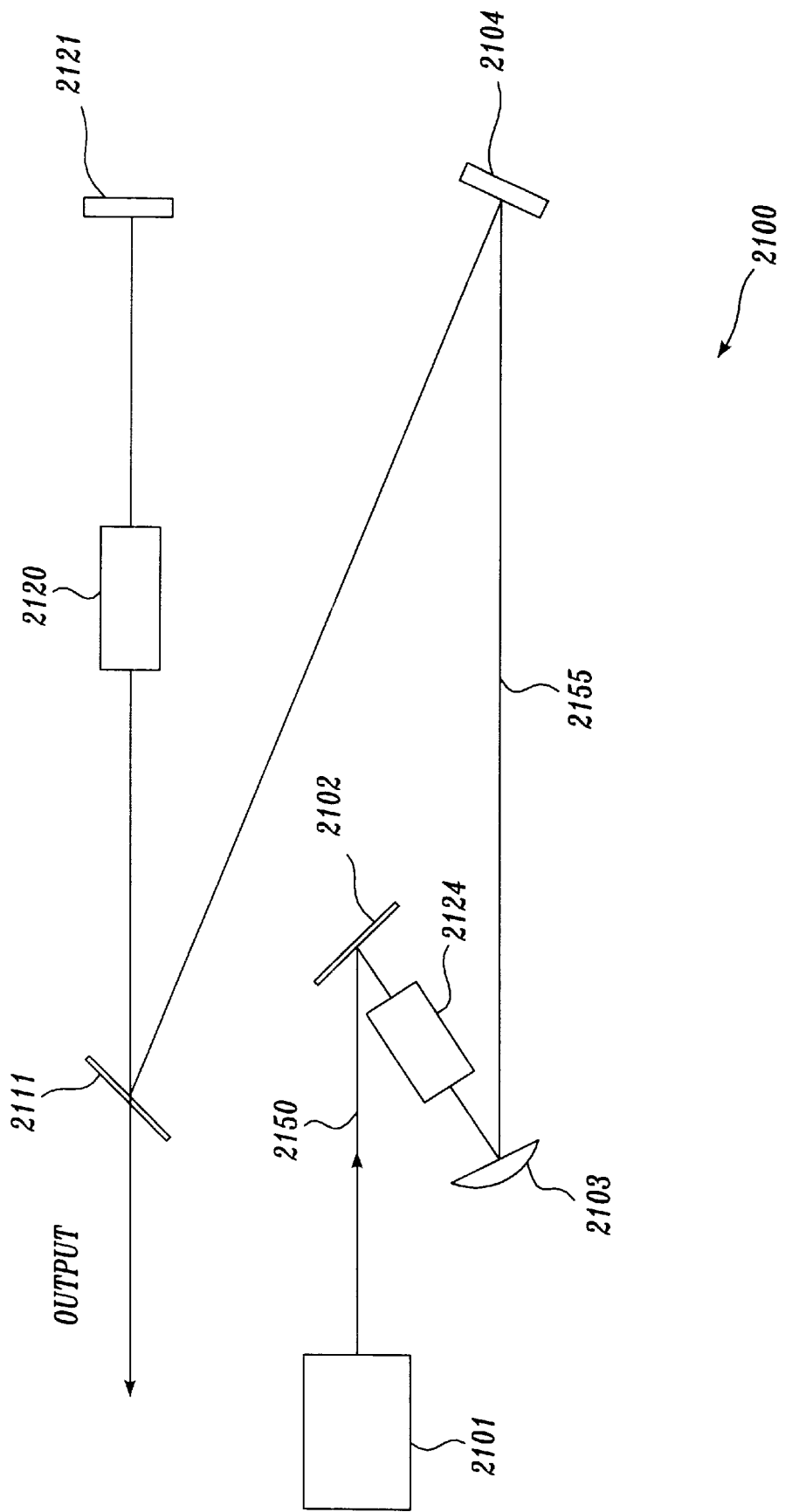
FIG. 15 is a schematic view of an embodiment of the present invention utilizing a beam shaping device, a gain medium, and a nonlinear crystal.

FIG. 15 is a schematic view of an alternate embodiment of the present invention utilizing a plurality of mirrors 2102, 2103, 2104 and 2121, a gain medium 2124, and a nonlinear crystal 2120 for creating a high-power blue or green laser from high-power diode laser device. The apparatus 2100 consists of a high-power diode laser device 2101, a flat mirror 2102, a gain medium 2124, a second flat mirror 2103, a third flat mirror 2104, a beam splitter 2111, a nonlinear crystal 2120, and a fourth flat mirror 2121. The laser device 2101 may include an infrared laser bar or laser array (for example, at wavelength of 810 nm). The gain medium 2124 is configured between the first mirror 2102 and the second mirror 2103 to form an end pump resonator cavity, as known to one skilled in the art. The laser beam passes back and forth between the first mirror 2102 and the second mirror 2103 resulting in an amplified laser beam 2155 of single mode. The gain medium 2124 consists of a Nd:YAG crystal or other like material. There are two lines which can be pumped by the same 810 nm laser light via the Nd:YAG crystal, i.e., 920 or 1064 nm, depending on the desired color of output light (green or blue).

The amplified laser beam 2155 is redirected from the second mirror 2103 to a beam splitter 2111. A third highly reflective mirror 2104 can be optionally used to redirect the light into the beam splitter 2111. The beam splitter 2111 and the fourth flat mirror 2121 create a resonator around the nonlinear crystal 2120 for the second harmonic generation of blue or green light generation, depending on the wavelength of the single-mode laser light 2155.

The beam splitter 2111 has a near zero percent reflectivity at wavelengths equal to the desired output wavelength, e.g. 460 or 532 nm and a near one-hundred percent reflectivity at 810 nm. Further, the fifth mirror 2121 is nearly one-hundred percent reflective at wavelengths equal to 810 nm.

In embodiment of FIG. 15, the nonlinear crystal 1908 is pumped from both ends by two highly reflective mirrors 2102 and 2103. The coupler design enables the astigmatic light from a diode bar to be transformed to a round beam of exceptional brightness, which is suitable for an efficient end-pumping geometry. High power diode-pumped rod lasers are usually pumped in a circularly symmetric, close-coupled arrangement as shown in FIG. 15. The coupler used in this embodiment allows transversal diode pumping to be transferred into a uniform absorbed power distribution inside a rectangular slab crystal 2124.

One should note that the cavity design of the above described embodiments allows the nonlinear material (YAG) to be pumped by 810 nm laser light from both ends to enhance the efficiency of the generation of 920 or 1046 nm light. The 920 or 1046 nm light is coupled to the nonlinear crystal through a Z cavity configuration and blue or green light is generated at this point. The nonlinear crystals used in this embodiment are similar to the nonlinear crystals used in the embodiment with single broad-area semiconductor lasers, described above with reference to FIG. 3.

The power of the 810 nm laser source is usually at the tens of watts level and can only be obtained through high power diode laser arrays, one-or two-dimensional array of broad area diode lasers. Usually in each one-dimensional array, also referred to as a diode laser bar, there are 20 to 40 broad area diode lasers, so each bar can give a power level at 20 to 40 watts. These bars usually have a width of 1 cm, versus about 100 micrometers of a broad area diode laser. Therefore, capturing the light from these laser arrays is even more difficult than the single source lasers described above. Therefore, the approach of the present invention involves a beam collector, which is basically a plurality of light tunnels with inner reflective surfaces having profiles of high order (higher than 2) polynomial equations. These light tunnels are designed to capture the light and confine them to an area of a few millimeters right before they enter the nonlinear material, which usually has a diameter of a few, e.g. 2 or 3, millimeters and a length of close to 10 millimeters for second harmonic at. generation.

Figure 16A:
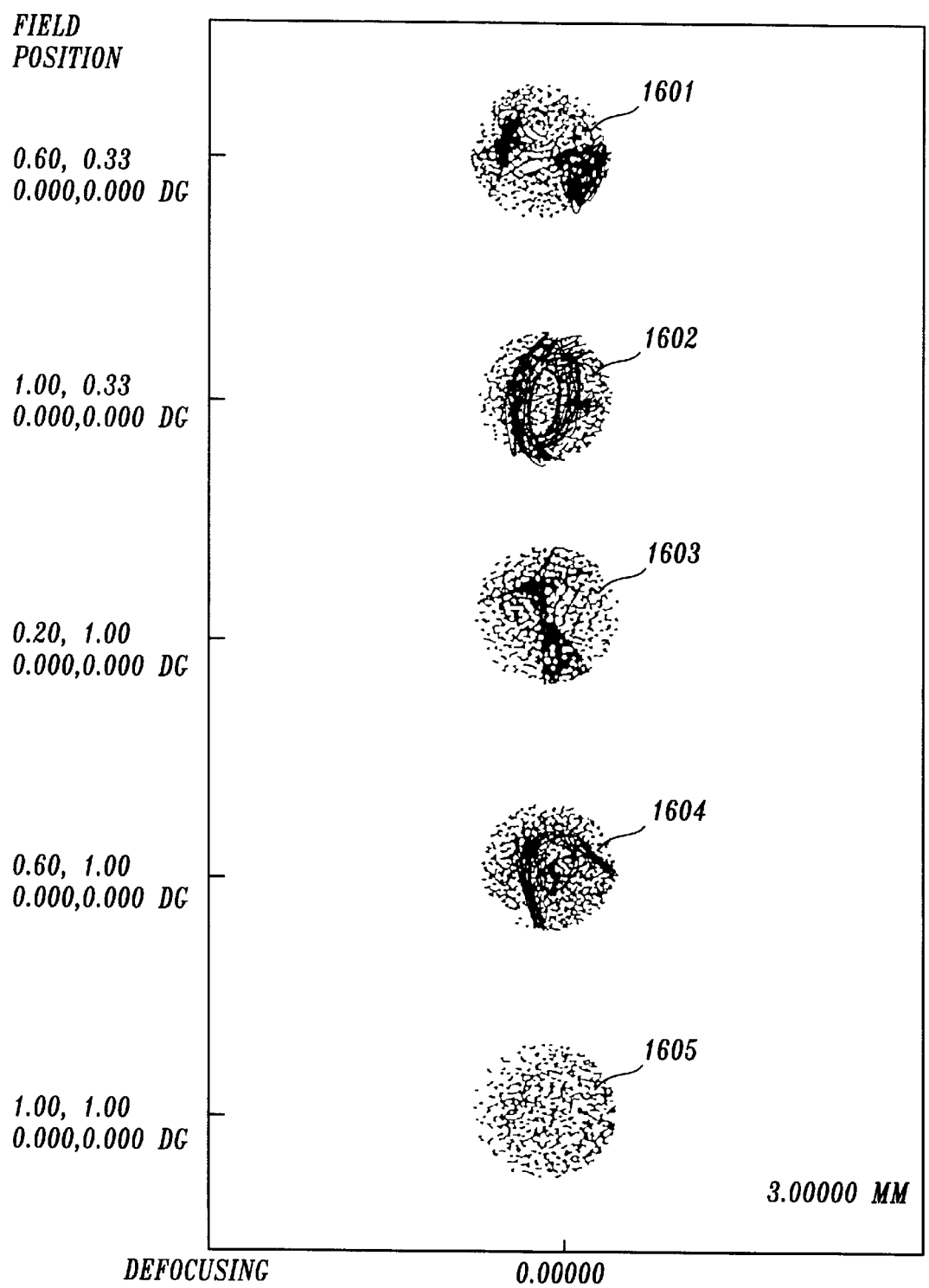
FIGS. 16A–16C respectively illustrate end, perspective and side views of an amplified corrected laser beam as it enters a gain medium.
Figure 16B:
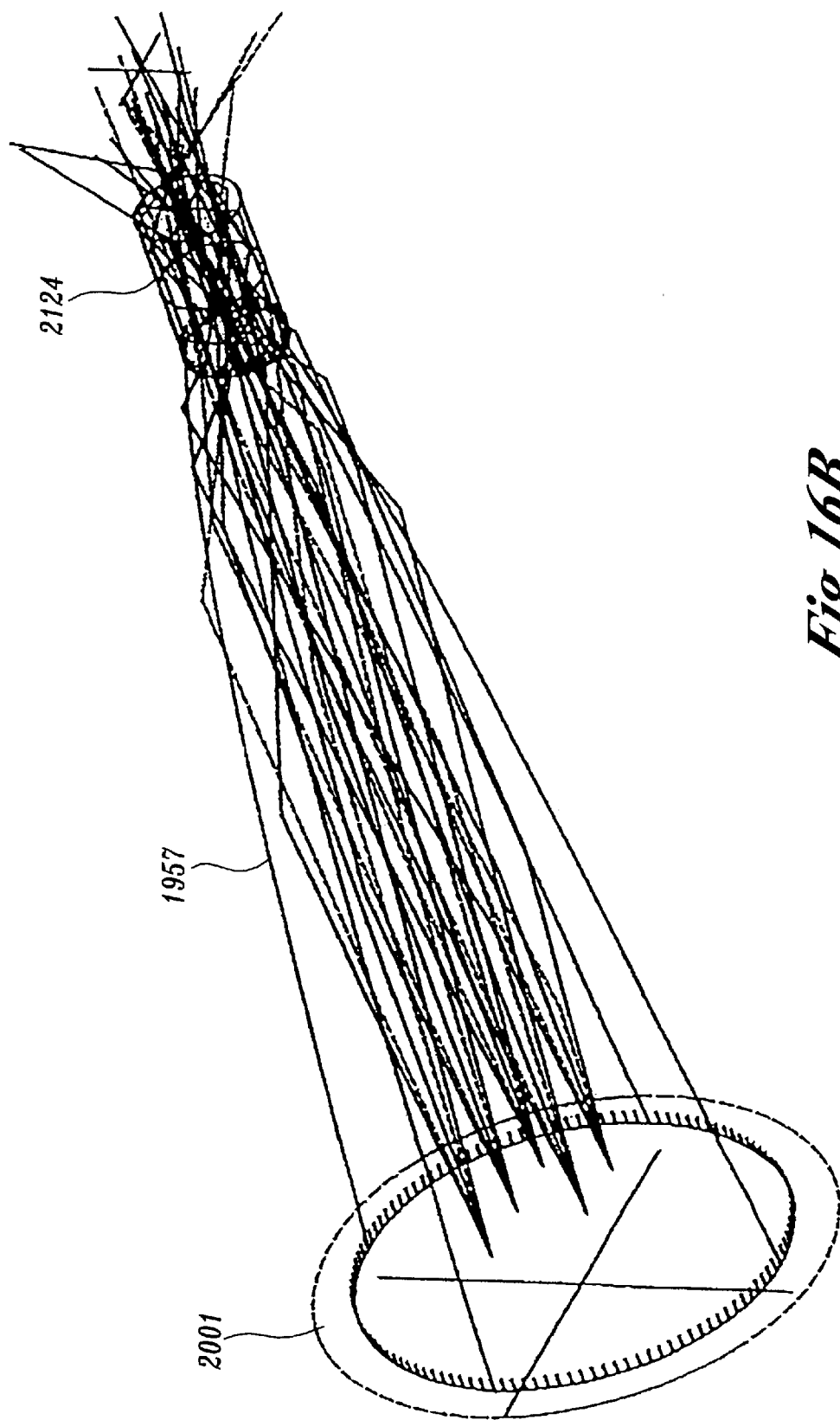
Figure 16C:
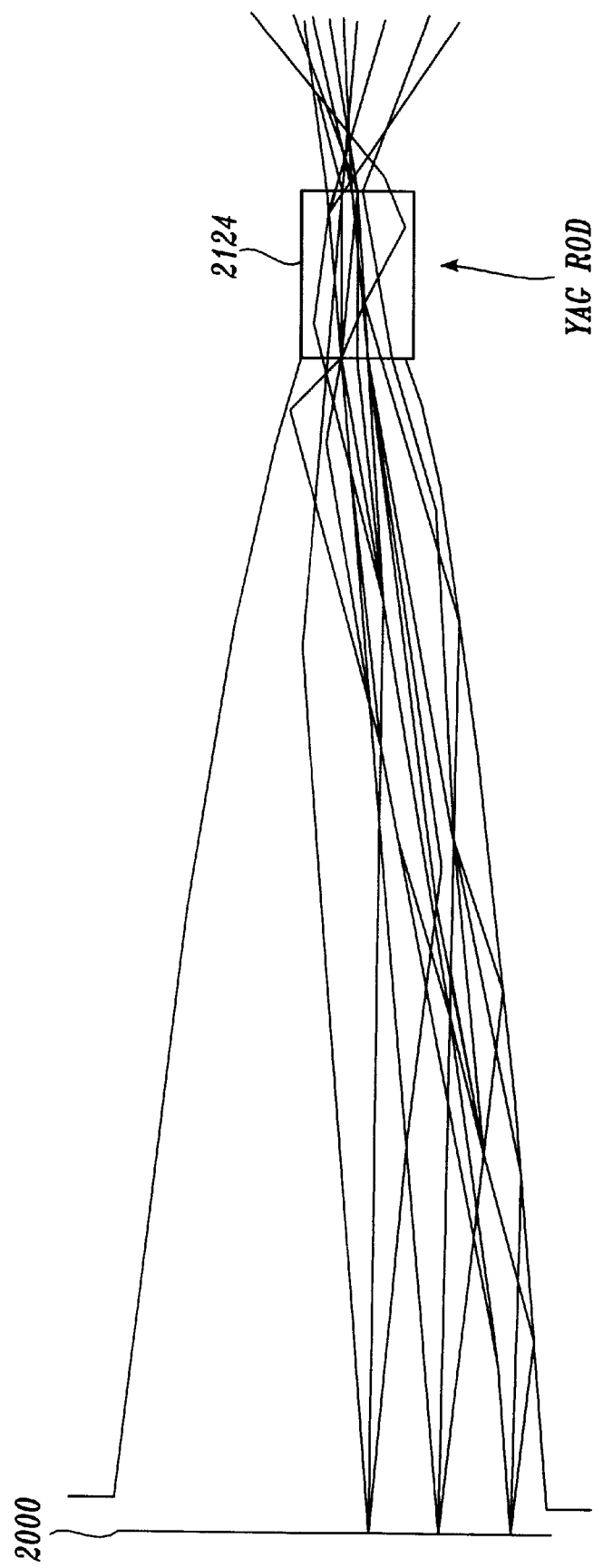

FIGS. 16A–16C respectively illustrate end, perspective and side views of the laser beam 2150 as it enters the gain medium (2124 of FIG. 15). These diagrams are provided for illustrative purposes to show how the diverging beams of the diode bar or diode array are focused by diffractive beam focusing device 2001 into a converging pattern as shown by laser beam 1957. FIG. 16 illustrates a plurality of intensity distribution end views 1601–1605 of the laser beam 1957 at the point where it strikes the gain medium 2124. As shown in FIG. 16A, the top four patterns 1601–1604 do not have uniform distributions, a laser beam that is not desirable in the above described embodiments. However, the bottom beam pattern 1605 does show a preferred laser beam having a uniform distribution, such as the beam having a Gaussian profile described above with reference to FIGS. 2A and 2B. FIGS. 16B and 16C show how the reflective surface with a high order polynomial function such as a parabolic function helps to direct the output of multiple single broad-area semiconductor lasers (in the form of a bar or array) into the small cross section of the gain medium 2124 end surface.

Returning to FIG. 15, once the corrected laser beam 2155 is passed through the reflective optic devices 2102–2103 and coupled to a gain medium 2124, the light passes through a nonlinear crystal 2120 in a manner similar to the above described embodiments with reference to FIGS. 2A, 2B, 3 and 4. By the use of the nonlinear crystal 2120, the second harmonic generated will provide the green or blue laser light. More specifically, gain medium 2124, which can be Nd:YAG, outputs a light beam 2155 with a 920 or 1064 nm wavelength and is positioned in a 920 or 1064 nm laser cavity extending between a mirror 2121 and a beam splitter 2111, also referred to as an output mirror or coupler mirror.

The laser cavity resonator formed by the mirror 2121 and a beam splitter 2111 force the laser light to run to-and-fro a few times in the laser cavity resonator. The mirror 2121 and a beam splitter 2111 are accordingly designed to be highly reflective for the fundamental wave of the laser. The beam splitter 2111 is designed to be the input mirror for the pumped light, being generally permeable for the wavelength of the pumped light. Accordingly, the mirror 2121 is highly reflective for the laser light at all wavelengths. Similar to the embodiments as described above utilizing the ring resonator 121, the blue or green laser light is generated by the reaction of the nonlinear crystal 2120. The nonlinear crystal 2120 is preferably a birefringent, nonlinear crystal, in particular BBO or LBO or $LiNbO_3$, while the laser gain medium may be Nd:YAG or other like materials.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A laser beam altering optical device, comprising:
   a mode controlling device for capturing a highly divergent, multi-mode laser beam received from a high-power broad area laser source, wherein the mode controlling device comprises an external optical reflector having a non-planar profile positioned to receive the multi-mode laser beam, wherein the optical reflector comprises a focal length from the surface of the optical reflector, wherein the laser source is positioned at the focal distance from the surface of the optical reflector, and wherein a narrow, single-mode laser beam with a non-uniform intensity profile is produced by the mode controlling device; and
   a frequency altering device configured to receive the single-mode laser beam, the frequency-altering device configured to produce a frequency altered laser light.

2. The optical device of claim 1, wherein the frequency-altering device is configured to produce a frequency altered laser light having a wavelength approximate to 490 nm.

3. The optical device of claim 1, wherein the frequency-altering device is configured to produce a frequency altered laser light having a wavelength approximate to 532 nm.

4. The optical device of claim 1, wherein the mode controlling device comprises a volume holographic transmission grating.

5. The optical device of claim 1, wherein the mode controlling device comprises:
   a volume holographic transmission grating positioned to receive the highly divergent light beam from the high-power broad area laser source, wherein the volume holographic transmission grating is configured to produce a diffracted output and a single-mode laser output, wherein the volume holographic transmission grating is configured to direct the single-mode laser output to the frequency altering device; and
   a mirror positioned to receive the diffracted output, wherein the mirror and volume holographic transmission grating are configured to create a feedback mechanism to the volume holographic transmission grating for controlling the spatial coherence of the highly divergent, multi-mode light beam.

6. The optical device of claim 5, wherein the volume holographic transmission grating is configured with a grating approximate to 900 grooves per millimeter.

7. The optical device of claim 1, wherein the mode controlling device comprises an external optical reflector having a Gaussian intensity profile promoting cavity facing a facet of the laser source of the multi-mode laser beam, wherein the cavity comprises a focal length from the cavity surface, the laser source positioned such that the facet is at the focal distance from the cavity surface; wherein a narrow, single-mode laser beam having a substantially Gaussian intensity is produced by the mode controlling device, and wherein the narrow, single-mode laser beam having a substantially Gaussian intensity is received by the frequency altering device.

8. The optical device of claim 7, wherein the external optical reflector is configured to produce a laser beam having a super-Gaussian intensity profile, wherein the laser beam having the super-Gaussian intensity profile is directed to and received by the frequency altering device.

9. The optical device of claim 7, wherein the external optical reflector is configured to produce a laser beam having a near-Gaussian intensity profile, wherein the laser beam having the near-Gaussian intensity profile is directed to and received by the frequency altering device.

10. The optical device of claim 1, wherein the mode controlling device comprises a digital diffractive optics device disposed adjacent the high-power broad area laser source, wherein the digital diffractive optics device is configured for shaping the multi-mode laser beam of the laser source into a narrow, single-mode laser beam.

11. The optical device of claim 10, wherein the digital diffractive optics device is constructed from a reflective diffraction grating.

12. The optical device of claim 10, wherein the digital diffractive optics device is constructed from a digital binary optics device.

13. The optical device of claim 10, wherein the digital diffractive optics device is constructed from a continuous surface-relief diffractive optics device.

14. The optical device of claim 1, wherein the optical further comprises a piano-convex lens having an optical diffractive element on a piano side of the piano-convex lens configured to focus laser light incident therewith, the piano-convex lens and the optical diffractive element is configured to receive the narrow, single-mode laser beam and produce an output that is received by the frequency altering device.

15. The optical device of claim 14, wherein the optical diffractive element is constructed from a digital binary optics device.

16. The optical device of claim 14, wherein the optical diffractive clement is constructed from a continuous surface-relief diffractive optics device.

17. The optical device of claim 1, wherein the frequency altering device comprises a ring resonator having a nonlinear crystal, wherein the ring resonator is positioned to receive the single-mode laser emitted from the mode controlling device, and configured to emit green laser light.

18. The optical device of claim 1, wherein the frequency altering device comprises a ring resonator having a nonlinear crystal, wherein the ring resonator is positioned to receive the single-mode laser emitted from the mode controlling device, and configured to emit blue laser light.

19. The optical device of claim 1, wherein the frequency altering device comprises:
  a first laser cavity formed by a plurality of mirrors configured to pump an optical gain medium, the optical gain medium comprising Neodymium doped yttrium-aluminum-garnet; and
  a second laser cavity formed by a plurality of mirrors for coupling the narrow, single-mode laser beam into a nonlinear crystal, and for generating a green laser light from the second laser cavity.

20. The optical device of claim 19, wherein the nonlinear crystal is selected from the group consisting of BBO, LBO, KTP, KTA, RTA, KRTA, and LiNbO$_3$.

21. The optical device of claim 1, wherein the frequency altering device comprises:
  a first laser cavity formed by a plurality of mirrors configured to pump an optical gain medium, the optical gain medium comprising Neodymium doped yttrium-aluminum-garnet; and
  a second laser cavity formed by a plurality of mirrors for coupling the narrow, single-mode laser beam into a nonlinear crystal, and for generating a blue laser light from the second laser cavity.

22. The optical device of claim 21, wherein the nonlinear crystal is selected from the group consisting of BBO, LBO, KTP, KTA, RTA, KRTA, and LiNbO$_3$.

23. A laser beam altering optical device, comprising:
  a semiconductor laser having an active gain region with a beam emitting facet;
  an external optical reflector having a Gaussian intensity profile promoting cavity facing the facet of the semiconductor laser, the cavity having a focal length a preselected distance from the cavity surface, the semiconductor laser positioned such that the facet is at the focal length distance from the cavity surface; wherein a laser beam with a substantially Gaussian intensity is produced; and
  a frequency altering device configured to receive the laser beam with the substantially Gaussian intensity, wherein the frequency altering device configured for producing a frequency altered laser light.

24. The optical device of claim 23, wherein the frequency-altering device is configured for producing a frequency altered laser light having a wavelength approximate to 490 nm.

25. The optical device of claim 23, wherein the frequency-altering device is configured for producing a frequency altered laser light having a wavelength approximate to 532 nm.

26. The optical device of claim 23, wherein the frequency altering device comprises a ring resonator having a nonlinear crystal, wherein the ring resonator is positioned to receive die beam with the substantially Gaussian intensity, and wherein the frequency altering device is configured to emit green laser light.

27. The optical device of claim 23, wherein the frequency altering device comprises a ring resonator having a nonlinear crystal, wherein the ring resonator is positioned to receive the beam with the substantially Gaussian intensity, and wherein the frequency altering device is configured to emit blue laser light.

28. A laser beam altering optical device, comprising:
  a digital diffractive optics device disposed adjacent a laser source for shaping a broad area laser beam emitted from the laser source, wherein the digital diffractive optics device is configured for shaping the multi-mode laser beam of the laser source into a narrow, single-mode laser beam; and
  a frequency-altering device configured to receive the narrow, single-mode laser beam from the digital diffractive optics device, wherein the frequency-altering device is configured for producing a frequency altered laser light.

29. The optical device of claim 28, wherein the frequency-altering device is configured for producing a frequency altered laser light having a wavelength approximate to 490 nm.

30. The optical device of claim 28, wherein the frequency-altering device is configured for producing a frequency altered laser light having a wavelength approximate to 532 nm.

31. The optical device of claim 28, wherein the laser source comprises a high-powered, multi-mode broad-area semiconductor laser.

32. The optical device of claim 28, wherein the frequency altering device comprises a ring resonator having a nonlinear crystal, wherein the ring resonator is positioned to receive the narrow, single-mode laser beam from the digital diffractive optics device, and wherein the frequency altering device is configured to emit blue laser light.

33. The optical device of claim 28, wherein the frequency altering device comprises a ring resonator having a nonlinear crystal, wherein the ring resonator is positioned to receive the narrow, single-mode laser beam from the digital diffractive optics device, and wherein the frequency altering device is configured to emit green laser light.

34. A laser beam altering optical device, comprising:
  a high-power laser source having an active gain region with a beam emitting facet, wherein the semiconductor laser is configured to emit a highly divergent multi-mode light beam;
  a volume holographic transmission grating positioned to receive the highly divergent multi-mode light beam from the high-power laser source, wherein the volume holographic transmission grating is configured to produce a diffracted output and a single-mode laser output;
  a mirror positioned to receive the diffracted output, wherein the mirror and the volume holographic transmission grating are configured to create a feedback mechanism for controlling the spatial coherence of the highly divergent, multi-mode light beam; and
  a frequency-altering device configured to receive the single-mode laser output from the volume holographic transmission grating, wherein the frequency-altering device configured for producing a frequency altered laser light.

35. The optical device of claim 34, wherein the volume holographic transmission grating is configured with a grating approximate to 900 grooves per millimeter.

36. The optical device of claim 34, wherein the frequency-altering device is configured for producing a frequency altered laser light having a wavelength approximate to 490 nm.

37. The optical device of claim 34, wherein the frequency-altering device is configured for producing a frequency altered laser light having a wavelength approximate to 532 nm.

38. The optical device of claim 34, wherein the frequency altering device comprises a ring resonator having a nonlinear crystal, wherein the ring resonator is positioned to receive the narrow, single-mode laser beam, and wherein the frequency altering device is configured to emit green laser light.

39. A laser beam altering optical device, comprising:

an array of laser emitting diodes; and a conically shaped optical device positioned to receive laser beams from the array of laser emitting diodes and configured to focus the laser beams into a single laser beam suitable for end-pumping an optical gain medium, wherein the optical gain medium is configured to emit an amplified laser beam; and a frequency-altering device configured to receive the amplified laser beam, wherein the frequency-altering device is configured for producing a frequency altered laser light.

40. The optical device of claim 39, wherein the frequency-altering device is configured to produce a frequency altered laser light having a wavelength approximate to 490 nm.

41. The optical device of claim 39, wherein the frequency-altering device is configured to produce a frequency altered laser light having a wavelength approximate to 532 nm.

42. The optical device of claim 39, wherein the optical gain medium comprises Neodymium doped yttrium-aluminum-garnet.

* * * * *

UNITED STATES PATENT AND TRADEMARK OFFICE
CERTIFICATE OF CORRECTION

PATENT NO. : 6,414,973 B1 Page 1 of 1
DATED : July 2, 2002
INVENTOR(S) : R.-J. Hwu et al.

It is certified that error appears in the above-identified patent and that said Letters Patent is hereby corrected as shown below:

Column 16,
Line 55, after "wherein the optical" insert -- device --
Line 56, "piano-convex" should read -- plano-convex --
Line 57, "piano side" should read -- plano side --
Line 57, "piano-convex" should read -- plano-convex --
Line 59, "diffractive element is" should read -- diffractive element are --

Column 17,
Line 50, "device configured" should read -- device is configured --
Line 63, "die" should read -- the --

Column 18,
Line 59, "device configured" should read -- device is configured --

Signed and Sealed this

Eighth Day of July, 2003

JAMES E. ROGAN
*Director of the United States Patent and Trademark Office*